US007274208B2

(12) United States Patent
DeHon et al.

(10) Patent No.: US 7,274,208 B2
(45) Date of Patent: Sep. 25, 2007

(54) NANOSCALE WIRE-BASED SUBLITHOGRAPHIC PROGRAMMABLE LOGIC ARRAYS

(75) Inventors: André DeHon, Pasadena, CA (US);
Michael J. Wilson, Portland, OR (US);
Charles M. Lieber, Lexington, MA (US)

(73) Assignee: California Institute of Technology, Pasadena, CA (US)

( * ) Notice: Subject to any disclaimer, the term of this patent is extended or adjusted under 35 U.S.C. 154(b) by 73 days.

(21) Appl. No.: 10/856,115

(22) Filed: May 28, 2004

(65) Prior Publication Data
US 2005/0017234 A1    Jan. 27, 2005

Related U.S. Application Data

(60) Provisional application No. 60/553,865, filed on Mar. 17, 2004, provisional application No. 60/535,211, filed on Jan. 9, 2004, provisional application No. 60/529,874, filed on Dec. 16, 2003, provisional application No. 60/502,548, filed on Sep. 12, 2003, provisional application No. 60/491,127, filed on Jul. 29, 2003, provisional application No. 60/475,171, filed on Jun. 2, 2003.

(51) Int. Cl.
G06F 7/38 (2006.01)
H03K 19/173 (2006.01)

(52) U.S. Cl. .............................. 326/38; 326/39; 326/41
(58) Field of Classification Search ............ 326/37–41, 326/47, 101, 136
See application file for complete search history.

(56) References Cited

U.S. PATENT DOCUMENTS

| 5,349,558 | A | 9/1994 | Cleveland et al. ........... 365/200 |
| 6,128,214 | A | 10/2000 | Kuekes et al. .............. 364/151 |
| 6,256,767 | B1 | 7/2001 | Kuekes et al. ................. 716/9 |
| 6,314,019 | B1 | 11/2001 | Kuekes et al. .............. 365/151 |
| 6,383,784 | B1 | 5/2002 | Smith ........................ 435/91.2 |
| 6,473,351 | B2 | 10/2002 | Tomanek et al. ........... 365/215 |
| 6,777,982 | B2 | 8/2004 | Goldstein et al. ........... 326/134 |
| 2002/0027819 | A1 | 3/2002 | Tomanek et al. ........... 365/215 |
| 2002/0175390 | A1 | 11/2002 | Goldstein et al. ........... 257/481 |
| 2003/0089899 | A1 | 5/2003 | Lieber et al. ................... 257/9 |

(Continued)

FOREIGN PATENT DOCUMENTS
WO    02/103753 A2    12/2002

(Continued)

OTHER PUBLICATIONS

Andre DeHon, Array-Based Architecture for FET-Based, Nanoscale Electronics, IEEE, Transactions on Nanotechnology, vol. 2. No. 1, Mar. 2003.*

(Continued)

Primary Examiner—Anh Q. Tran
(74) Attorney, Agent, or Firm—Ladas & Parry LLP

(57) ABSTRACT

An apparatus and methods for a sublithographic programmable logic array (PLA) are disclosed. The apparatus allows combination of non-restoring, programmable junctions and fixed (non-programmable) restoration logic to implement any logic function or any finite-state machine. The methods disclosed teach how to integrate fixed, restoration logic at sublithographic scales along with programmable junctions. The methods further teach how to integrate addressing from the microscale so that the nanoscale crosspoint junctions can be programmed after fabrication.

87 Claims, 27 Drawing Sheets

U.S. PATENT DOCUMENTS

| | | | |
|---|---|---|---|
| 2003/0200521 A1* | 10/2003 | DeHon et al. | 716/16 |
| 2003/0206436 A1 | 11/2003 | Eaton, Jr. et al. | 365/177 |
| 2004/0113138 A1 | 6/2004 | DeHon et al. | 257/9 |
| 2004/0113139 A1 | 6/2004 | Dehon et al. | 257/9 |

FOREIGN PATENT DOCUMENTS

| | | |
|---|---|---|
| WO | 03/063208 A2 | 7/2003 |
| WO | 2004/034467 A2 | 4/2004 |
| WO | 2004/061859 A2 | 7/2004 |

OTHER PUBLICATIONS

DeHon, A., "Array-Based Architecture for FET-Based, Nanoscale Electronics," *IEEE Transactions on Nanotechnology*, vol. 2, No. 1, pp. 23-32 (Mar. 2003).

International Written Opinion for the corresponding PCT Application No. PCT Application No. PCT/US03/01555, issued on Jun. 30, 2005 (7 pages).

Ziegler, M. M., ert al., "CMOS/NANO Co-Design for Crossbar-based Molecular Electronics Systems" *IEEE Transactions on Nanotechnology*, vol. 2, No. 4, pp. 217-230 (Dec. 4, 2004).

Albrecht, O., et al., "Construction and Use of LB Deposition Machines for Pilot Production," *Thin Solid Films*, vol. 284-285, pp. 152-156 (Sep. 15, 1996).

Björk, M.T., et al., "One-Dimensional Steeplechase for Electrons Realized," *Nano Letters*, vol. 2, No. 2, pp. 87-89 (2002).

Brown, C.L., et al., "Introduction of [2]Catenanes Into Langmuir Films and Langmuir-Blodgett Multilayers. A Possible Strategy for Molecular Information Storage Materials," *Langmuir*, vol. 16, No. 4, pp. 1924-1930 (2000).

Chen, Y., et al., "Nanoscale Molecular-Switch Crossbar Circuits," *Institute of Physics Publishing*, Nanotechnology 14, pp. 462-468 (2003).

Chen, Y., et al., "Self-Assembled Growth of Epitaxial Erbium Disilicide Nanowires on Silicon (001)," *Applied Physics Letters*, vol. 76, No. 2, pp. 4004-4006 (Jun. 26, 2000).

Chou, S.Y., "Sub-10 nm Imprint Lithography and Applications," *J. Vac. Sci. Technol. B*, vol. 15, No. 6, pp. 2897-2904 (Nov./Dec. 1997).

Collier, C.P., et al., "A [2]Catenane-Based Solid State Electronically Reconfigurable Switch," *Science*, vol. 289, pp. 1172-1175 (Aug. 18, 2000).

Collier, C.P., et al., "Electronically Configurable Molecular-Based Logic Gates," *Science*, vol. 285, pp. 391-394 (Jul. 16, 1999).

Cui, Y., et al., "Diameter-Controlled Synthesis of Single-Crystal Silicon Nanowires," *Applied Physics Letters*, vol. 78, No. 15, pp. 2214-2216 (Apr. 9, 2001).

Cui Y., et al., "Doping and Electrical Transport in Silicon Nanowires," *The Journal of Physical Chemistry*, vol. 104, No. 22, pp. 5213-5216 (Jun. 8, 2000).

Cui, Y., et al., "Functional Nanoscale Electronic Devices Assembled Using Silicon Nanowire Building Blocks," *Science*, vol. 291, pp. 851-853 (Feb. 2, 2001).

Dekker, C., "Carbon Nanotubes As Molecular Quantum Wires," *Physics Today*, pp. 22-28 (May 1999).

Derycke, V., et al., "Carbon Nanotube Inter- and Intramolecular Logic Gates," *Nano Letters*, vol. 1, No. 9, pp. 453-456 (Sep. 2001).

Goldstein, S.C., et al., "NanoFabrics: Spatial Computing Using Molecular Electronics," *Proc. Of The 28th Annual International Symposium on Computer Architecture*, pp. 1-12 (Jun. 2001).

Gudiksen, M.S., et al., "Growth of Nanowire Superlattice Structures for Nanoscale Photonics and Electronics," *Nature*, vol. 415, pp. 617-620 (Feb. 7, 2002).

Huang, Y., et al., "Directed Assembly of One-Dimensional Nanostructures Into Functional Networks," *Science*, vol. 291, pp. 630-633 (Jan. 26, 2001).

Huang, Y., et al., "Logic Gates and Computation From Assembled Nanowire Building Blocks," *Science*, vol. 294, pp. 1313-1317 (Nov. 9, 2001).

Lauhon, L.J., et al., "Epitaxial Core-Shell and Core-Multishell Nanowire Heterostructures," *Nature*, vol. 420, pp. 57-61 (Nov. 7, 2002).

Lieber, C.M., "Nanowire Superlattices," *Nano Letters*, vol. 2, No. 2, pp. 81-82 (Feb. 2002).

Morales, A.M., et al., "A Laser Ablation Method for the Sythesis of Crystalline Semiconductor Nanowires," *Science*, vol. 279, pp. 208-211 (Jan. 9, 1998).

Tans, S.J., et al., "Room-Temperature Transitor Based On A Single Carbon Nanotube," *Nature*, vol. 393, pp. 49-52 (May 7, 1998).

Ulman, A., "Part Two: Langmuir-Blodgett Films," *An Introduction to Ultrathin Organic Films*, Section 2.1, pp. 101-132 (1991).

Whang, D., et al., "Nanolithography Using Hierarchically Assembled Nanowire Masks," *Nano Letters*, vol. 3, No. 7, pp. 951-954 (2003).

Wu, Y., et al., "Block-by-Block Growth of Single-Crystaline Si/SiGe Superlattice Nanowires," *Nano Letters*, vol. 2, No. 2, pp. 83-86 (2002).

U.S. Appl. No. 10/853,907, filed May 25, 2004, DeHon et al.

U.S. Appl. No. 10/925,863, filed Aug. 24, 2004, DeHon.

* cited by examiner

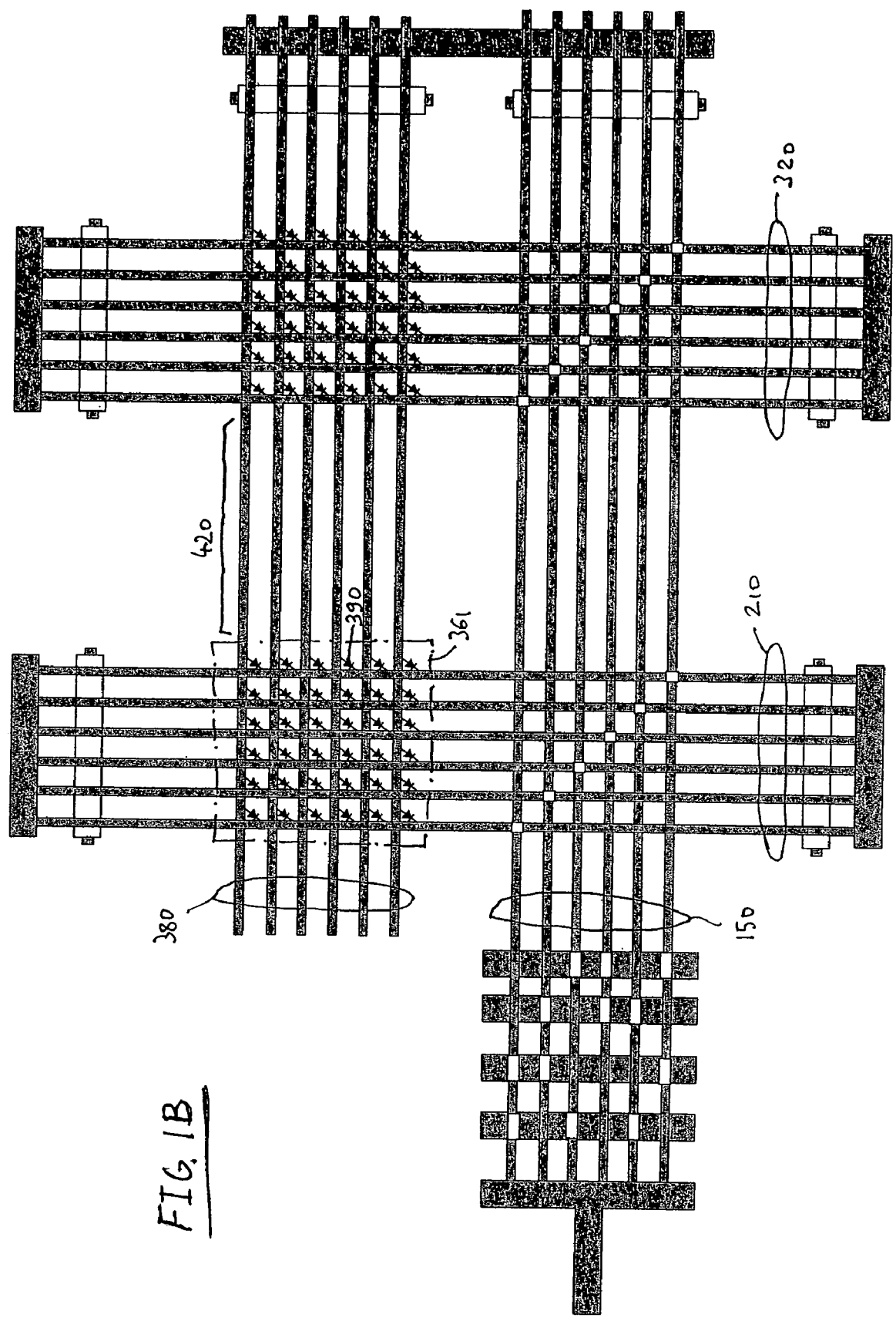

| $N_{inputs}$ | $N_{restore}$ | | | | | | | | |
|---|---|---|---|---|---|---|---|---|---|
| | 20 | 30 | 40 | 50 | 60 | 70 | 80 | 90 | 100 |
| 20 | 10 | 12 | 14 | 16 | 17 | 17 | 18 | 18 | 19 |
| 40 | 12 | 17 | 21 | 24 | 27 | 29 | 30 | 32 | 33 |
| 60 | 14 | 19 | 24 | 29 | 33 | 36 | 39 | 41 | 43 |
| 80 | 15 | 21 | 27 | 32 | 36 | 41 | 44 | 48 | 51 |
| 100 | 15 | 22 | 28 | 34 | 39 | 44 | 48 | 52 | 56 |
| 120 | 16 | 23 | 29 | 36 | 41 | 47 | 52 | 56 | 60 |
| 140 | 16 | 23 | 30 | 37 | 43 | 49 | 54 | 59 | 64 |
| 160 | 16 | 24 | 31 | 38 | 44 | 50 | 56 | 62 | 67 |
| 180 | 16 | 24 | 32 | 39 | 45 | 52 | 58 | 64 | 69 |
| 200 | 17 | 25 | 32 | 39 | 46 | 53 | 59 | 65 | 71 |

FIG.3

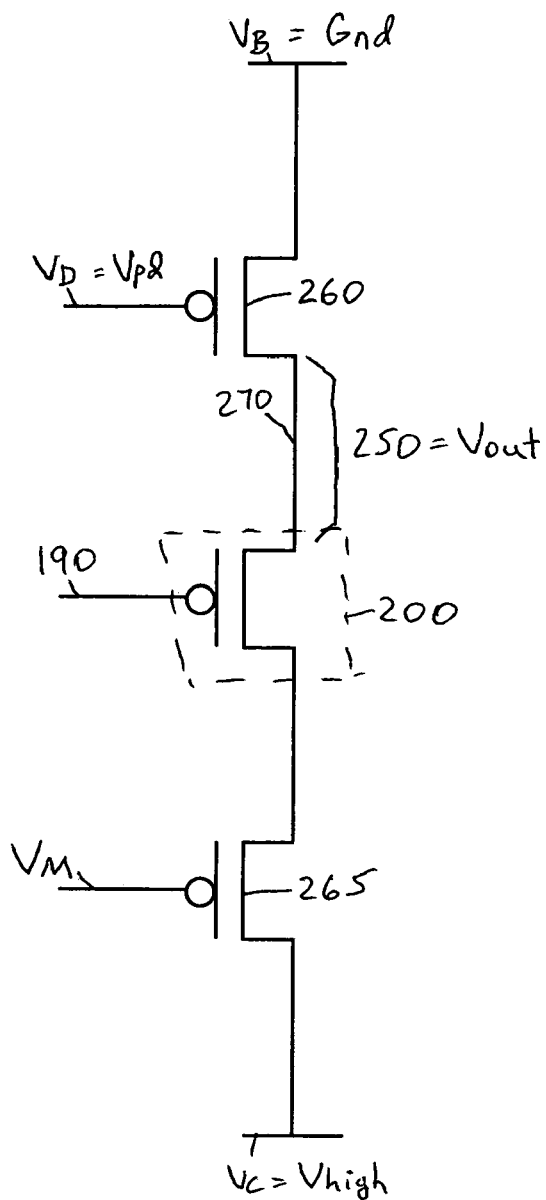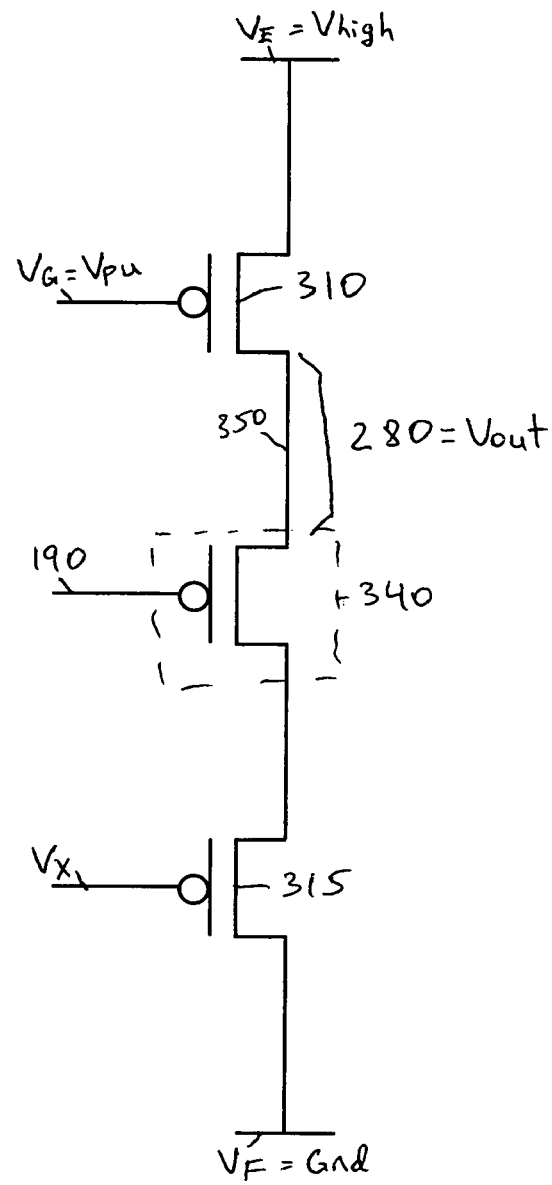
FIG. 6
FIG. 8

NANOSCALE WIRE-BASED SUBLITHOGRAPHIC PROGRAMMABLE LOGIC ARRAYS

CROSS-REFERENCE TO RELATED APPLICATIONS

This application claims the benefit of U.S. provisional Patent Application Ser. No. 60/475,171, filed Jun. 2, 2003 for "Implementation of Computation Note 18: Address Corrected, Sublithographic Memory Designs" by Andre' DeHon, U.S. provisional Patent Application Ser. No. 60/491,127, filed Jul. 29, 2003 for "Implementation of Computation Note 21: Molecular PLA Design Notes" by Andre' DeHon, U.S. provisional Patent Application Ser. No. 60/502,548, filed Sep. 12, 2003 for "Nanowire-Based Sublithographic Programmable Logic Arrays" by Andre' DeHon, U.S. provisional Patent Application Ser. No. 60/529,874, filed Dec. 16, 2003 for "Implementation of Computation Note 21e: Sublithographic PLA Design Notes" by Andre' DeHon, U.S. provisional Patent Application Ser. No. 60/535,211, filed Jan. 9, 2004 for "Nanowire-Based Sublithographic Programmable Logic Arrays" by Andre' DeHon, and U.S. provisional Patent Application Ser. No. 60/553,865, filed Mar. 17, 2004 for "Deterministic Addressing of Nanoscale Devices Assembled at Sublithographic Pitches" by Andre' DeHon, the disclosure of all of which is incorporated herein by reference.

STATEMENT REGARDING FEDERALLY SPONSORED RESEARCH OR DEVELOPMENT

The present invention was made with support from the United States Government under Grant number N00014-01-0651 awarded by the Office of Naval Research of the Department of the Navy. The United States Government has certain rights in the invention.

BACKGROUND

1. Field

The present disclosure relates to programmable logic arrays (PLAs). In particular, it relates to a sublithographic PLA.

2. Related Art

Before lithographic integrated circuits, logic was "customized" by discrete wiring (e.g. patch cables). Once lithography could support enough logic on a single chip to accommodate programmable configuration elements, it became useful to include memory elements which could configure the state of the device. As a result PALs (Programmable Array Logic), PLDs (Programmable Logic Devices), and ultimately FPGAs (Field Programmable Gate Arrays) were developed.

A PLA is a programmable device used to implement combinational logic circuits. A PLA is often said to have an "AND" plane followed by an "OR" plane. In practice, universal gates such as NAND or NOR gates are normally used. Usually, a PLA has a selective inversion capability, which makes it irrelevant whether the actual logic is NAND, NOR or AND, OR. Further, PLAs exploit DeMorgan's equivalences, so that a native NOR plane (with selective inversion) can act as a NAND plane or vice versa.

Over the past few years, many technologies have been demonstrated for molecular-scale memories. So far, they all seem to have: (1) resistance which changes significantly between "on" and "off" states, (2) the ability to be made rectifying, and (3) the ability to turn the device "on" or "off" by applying a voltage differential across the junction. An 8×8 crossbar made from rotaxane molecules has been demonstrated. It has been observed that an order of magnitude resistance difference between "on" and "off" state junctions could be forced. See, C. Collier, G. Mattersteig, E. Wong, Y. Luo, K. Beverly, J. Sampaio, F. Raymo, J. Stoddart, and J. Heath, A[2]Catenane-Based Solid State Reconfiguration Switch, Science, 289:1172-1175, 2000; C. P. Collier, E. W. Wong, M. Belohradsky, F. M. Raymo, J. F. Heath, Electronically configurable molecular-based logic gates, Science, 285:391-394, 1999.

Additional restoration circuits are disclosed in PCT publication WO 03/063208.

As a consequence, simple and manufacturable ways of integrating restoration with programmability are needed. Further, manufacturable techniques which allow wires to be tightly packed at nanoscale pitches and allow the nanoscale crosspoints to be addressed from microscale wires are needed.

SUMMARY

According to the present disclosure, use of nanoscale or sublithographic wires to build PLAs and interconnected PLAs is disclosed.

According to a first aspect, a programmable logic array (PLA) is disclosed, comprising: a first plurality of nanoscale wires forming PLA inputs; and a restoring inverting arrangement connected with the PLA inputs, comprising a second plurality of nanoscale wires, the restoring inverting arrangement restoring signals on the PLA inputs and inverting the signals on the PLA inputs.

According to a second aspect, an electric circuit comprising programmable logic arrays (PLAs) is disclosed, wherein: each PLA comprises nanoscale wires forming PLA inputs and at least one between a restoring inverting stage and a restoring non-inverting stage, the restoring inverting stage and the restoring non-inverting stage comprising nanoscale wires and restoring or inverting signals, respectively, of the PLA inputs; each PLA comprises programmable ON-OFF devices associated with crosspoints between the nanoscale wires, forming ON-OFF stages; and an output of at least one PLA is an input to at least one other PLA.

According to a third aspect, a method of building a programmable logic array (PLA) is disclosed, the method comprising: providing a first plurality of nanoscale wires forming PLA inputs; providing a restoring inverting arrangement connected with the PLA inputs, the restoring inverting arrangement comprising a second plurality of nanoscale wires and restoring signals on the PLA inputs and inverting the signals on the PLA inputs.

According to a fourth aspect, a method of placing a signal on a nanoscale wire forming an input of a programmable logic array (PLA) is disclosed, the method comprising: providing a plurality of nanoscale wires forming PLA inputs, wherein each of the nanoscale wires forming PLA inputs comprises one or more controllable regions; crossing a plurality of ohmic contacts with the controllable regions of the nanoscale wires forming PLA inputs; applying a first voltage to the nanoscale wires forming PLA inputs; providing ohmic contacts to correspond with the controllable regions of at least one nanoscale wire forming a PLA input; applying a second voltage to some of the ohmic contacts; and applying a third voltage to the remaining ohmic contacts.

According to a fifth aspect, a method of inverting and restoring an input signal is disclosed, the method comprising: providing a first plurality of nanoscale wires forming PLA inputs; providing a second plurality of nanoscale wires, wherein each nanoscale wire of the second plurality of nanoscale wires comprises a first end point, a second end point, at least two field effect junctions between the first end point and the second end point, and one or more controllable regions between the at least two field effect junctions; providing ohmic contacts at the first and second endpoints; crossing the controllable regions of the second plurality of nanoscale wires with the first plurality of nanoscale wires; applying a first and second voltages to the at least two field effect junctions so as to discharge any residual voltage on the second plurality of nanoscale wires; applying a signal to the first plurality of nanoscale wires forming PLA inputs; and applying a third voltage and a fourth voltage to the first end point and the second end point, respectively, so as to cause the signal to be inverted on one of the nanoscale wires in the second plurality of nanoscale wires.

According to a sixth aspect, a method of non-inverting and restoring an input signal is disclosed, the method comprising: providing a first plurality of nanoscale wires forming inputs of a programmable logic array (PLA); providing a second plurality of nanoscale wires, wherein each nanoscale wire of the second plurality of nanoscale wires comprises a first end point, a second end point, at least two field effect junctions between the first end point and the second end point, and one or more controllable regions between the at least two field effect junctions; crossing the controllable regions of the second plurality of nanoscale wires with the first plurality of nanoscale wires; applying a first and second voltages to the at least two field effect junctions so as to discharge any residual voltage on the second plurality of nanoscale wires; applying a signal to the first plurality of nanoscale wires forming PLA inputs; and applying a third voltage and a forth voltage to the first end point and the second end point, respectively, so as to cause the signal to be non-inverted on one of the nanoscale wires in the second plurality of nanoscale wires.

According to a seventh aspect, a method of OR-ing input signals is disclosed, the method comprising: providing a first plurality of nanoscale wires forming inputs of an OR function; providing a second plurality of nanoscale wires forming outputs of the OR function, wherein each nanoscale wire of the second plurality of nanoscale wires comprises a first end point, a second end point, and at least one field effect junction between the first end point and the second end point; crossing the first plurality of nanoscale wires with the second plurality of nanoscale wires so that a plurality of crossing points are disposed between the at least one field effect junction and the first end point; providing ON-OFF devices; electrically connecting the first plurality of nanoscale wires with the second plurality of nanoscale wires at the plurality of crossing points through the ON-OFF devices; applying a first voltage to the at least one field effect junction, so as to discharge any residual voltage on the second plurality of nanoscale wires; applying a second voltage to the second end; and applying one or more signals to the first plurality of nanoscale wires forming inputs of the OR function so as to cause the one or more signals to be OR-ed on one of the nanoscale wires in the second plurality of nanoscale wires.

According to an eighth aspect, a method of AND-ing input signals is disclosed, the method comprising: providing a first plurality of nanoscale wires forming inputs of an AND function; providing a second plurality of nanoscale wires forming outputs of the AND function, wherein each nanoscale wire of the second plurality of nanoscale wires comprises a first end point, a second end point, and at least one field effect junction between the first end point and the second end point; crossing the first plurality of nanoscale wires with the second plurality of nanoscale wires so that a plurality of crossing points are disposed between the at least one field effect junction and the first end point; providing ON-OFF devices; electrically connecting the first plurality of nanoscale wires with the second plurality of nanoscale wires at the plurality of crossing points through the ON-OFF devices; applying a first voltage to the at least one field effect junction, so as to charge the second plurality of nanoscale wires; applying a second voltage to the second end; and applying one or more signals to the first plurality of nanoscale wires forming inputs of the AND function so as to cause the one or more signals to be AND-ed on one of the nanoscale wires in the second plurality of nanoscale wires.

According to a ninth aspect, a method for testing for a valid address is disclosed, the method comprising:, providing a first plurality of nanoscale wires forming inputs of a programmable logic array (PLA), wherein each of the nanoscale wires forming PLA inputs comprises a first end, a second end, and one or more controllable regions disposed between the first end and the second end; crossing a plurality of ohmic contacts with the controllable regions of the first plurality nanoscale wires forming PLA inputs; grounding the second end of the first plurality nanoscale wires forming PLA inputs; disconnecting the second end of the first plurality nanoscale wires forming PLA inputs from a voltage supply; applying one or more first voltages to the controllable regions for an address to be tested; applying a second voltage to the first end of the first plurality nanoscale wires forming PLA inputs; measuring the second end of the first plurality nanoscale wires forming PLA inputs to test presence of the second voltage.

According to a tenth aspect, a method for testing restoration of an input signal from a valid address is disclosed, the method comprising: providing a first plurality of nanoscale wires forming inputs of a programmable logic array (PLA) comprising a first end, a second end, a field effect junction between the first end and the second end, and a programming region at the first end; providing a second plurality of restoring nanoscale wires comprising a top end, a bottom end, one or more control regions between the top end and the bottom end; crossing the control regions of the second plurality of restoring nanoscale wires with the first plurality of nanoscale wires forming PLA inputs; setting the top end to a low voltage; driving the bottom end to the low voltage; releasing the bottom end from the low voltage; setting all the nanoscale wires high by applying a high voltage to the first end, the second end and the field effect junction; release the first end, the second end and the field effect junction from the high voltage; applying a valid address to the programming region; applying the low voltage to the programming region; applying the high voltage to the top end; measuring the bottom end of the second plurality nanoscale wires for the high voltage.

According to an eleventh aspect, a method for implementing a circuital logic at nanoscale level is disclosed, comprising: providing microscale wires; providing nanoscale wires associated with the microscale wires; forming nano-nanoscale crosspoints between nanoscale wires and nanoscale wires; and programming the nano-nanoscale crosspoints.

According to a twelfth aspect, a method for restoring nanoscale signals is disclosed, comprising: providing nanoscale input wires adapted to carry input signals to be restored; providing nanoscale output wires to provide restored outputs; crossing the nanoscale input wires with the nanoscale output wires, thus forming crossing regions; providing ohmic contacts to power supplies, associated with the nanoscale output wires; and providing field-effect control lines, associated with the nanoscale output wires.

According to a thirteenth aspect, a programming region for a sublithographic programmable logic array (PLA) is disclosed, wherein the PLA comprises a first set of nanoscale wires and a second set of nanoscale wires intersecting the first set of nanoscale wires, the programming region comprising: a set of microscale wires crossing the first set of nanoscale wires; and controllable regions distributed along the nanoscale wires of the first set of nanoscale wires, allowing the nanoscale wires to be controlled by means of signals input to the set of microscale wires, wherein the signals input to the set of microscale wires allow at least one of the nanoscale wires of the first set of nanoscale wires to be programmed with a signal used as an input for the PLA.

According to a fourteenth aspect, a plurality of programmable logic arrays (PLAs) is disclosed, each PLA comprising a first set of nanoscale wires, a second set of nanoscale wires intersecting the first set of nanoscale wires, and a programming region, wherein: first sets of nanoscale wires for different PLAs being shared among the different PLAs, thus forming a common set of nanoscale wires; and the programming region is shared among the PLAs.

BRIEF DESCRIPTION OF THE DRAWINGS

FIGS. 1A and 1B depict a single-plane sublithographic Programmable Logic Array (PLA);

FIG. 3 depicts a table;

FIG. 6 depicts a unit equivalent electric circuit of the inverting restoration plane;

FIG. 8 depicts a unit equivalent electric circuit of the non-inverting restoration plane;

DETAILED DESCRIPTION

Figure 1A:
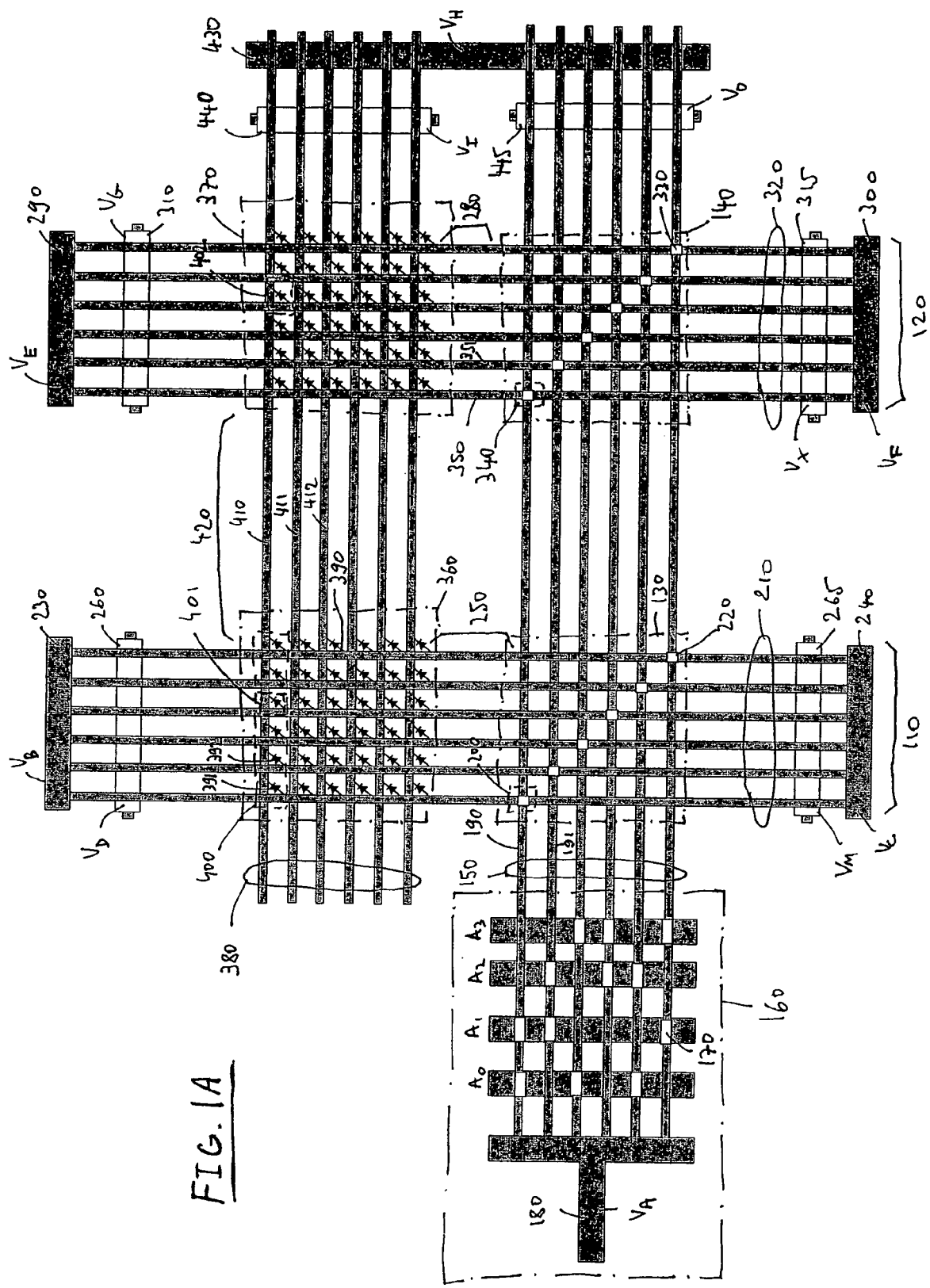

FIG. 1A discloses a single-plane sublithographic PLA made with nanoscale wires.

Nanoscale wires 150, 210, 320 and 380 can be grown to controlled dimensions on the nanometer scale using seed catalysts (e.g. gold balls) to define their diameter. Flow techniques can be used to align a set of nanoscale wires 150, 210, 320 or 380 into a single orientation, close pack the nanoscale wires, and transfer the nanoscale wires onto a surface. This step can be rotated and repeated to get multiple layers of nanoscale wires such as crossed nanowires (e.g. 150, 380 cross 210, 320) for building a crossbar array or memory core. By controlling the mix of elements in the environment during growth, nanoscale wires' are doped to create controllable regions 170, 220 to control nanoscale wires electrical properties. See, Y. Cui, X. Duan, J. Hu, and C. M. Liebe, Doping and electrical transport in silicon nanowires, Journal of Physical Chemistry B, 104(22):5213-5216, Jun. 8, 2000.

The doping profile along the length of a nanoscale wire can be controlled by varying the dopant level in the growth environment over time. See M. S. Gudiksen, L. J. Lauhon, J. Wang, D. C. Smith, and C. M. Lieber, Growth of nanowire superlatice structures for nanoscale photonics and electronics, Nature, 415:617-620, Feb. 7, 2002. As a result, control over growth rate allows to control the physical dimensions of these features down to almost atomic precision. The doping profile can also be controlled along the radius of these nanoscale wires, which allows nanoscale wires to be sheathed in insulators (e.g. silicon dioxide) to control spacing between conductors and between gated wires and control wires. See, M. S. G. Lincoln, J. tauhon, D. Wang, and C. M. Lieber, Epitaxial core-shell and core-multi-shell nanowire heterostructures, Nature, 420:57-61, 2002; D. Wang, S. Jin, and C. M. Lieber, Nanolithography using hierarchically assembled nanowire masks, Nanoletters, 3(7):951-954, Jul. 9, 2003. Conduction through controllable regions 170, 220 can be controlled via an electrical field like Field-Effect Transistors (FETs), as later explained in further detail.

As described above, nanoscale wires 150, 240, 320 and 380 can be packed at a tight pitch into crossbars with programmable crosspoints 401, 402 at their junctions. Crosspoints 401, 402 which both switch conduction between the crossed wires and store their own state can be placed at every wire crossing without increasing the pitch of the crossbar array. The nanoscale wires can be individually addressed from the lithographic or nanowire scale. No lithography is required to define the nanoscale features in the crossbar; lithography or nanoscale wires are used to define the extents of the crossbar, provide addressing for bootstrap programming, and provide voltage supplies for the nanoscale wire array. The pitch of the nanoscale wires 150 is much smaller than lithographic patterning. The crosspoint programmability is used to configure logic functions into nanoscale devices. To configure logic functions into nanoscale devices, a defined voltage is selectively placed on a single row nanoscale wire 190 and column nanoscale wire 270 in order to set the state of the crosspoint 401.

A programming structure 160 allows a single nanoscale wire of the plurality of horizontal nanoscale wires 150 to be selected, for example nanoscale wire 190. Selection of the nanoscale wire 190 will allow the vertical nanoscale wires 270 and 350 to be selected. Similarly, selection of the nanoscale wire 191 will allow the vertical nanoscale wires 271 and 351 to be selected. By constructing nanoscale wires 150 with controllable regions 170 on their ends, each nanoscale wire is given an address. The dimensions of the address bit control regions 170 can be set to the lithographic or nanoscale pitch so that a set of crossed, lithographic or nanoscale wires $A_0 \ldots A_3$ can be used to address any one of nanoscale wires 150. The remaining portion of each of the nanoscale wires 150 is doped heavily enough so that the crossed lithographic or nanoscale wires $A_0 \ldots A_3$ do not affect the conduction in the remaining portion of each of the nanoscale wires 150. If all the nanoscale wires 150 are coded along one dimension of an array with suitably different codes, a unique nanoscale wire addressability is achieved, effectively implementing a demultiplexer between a small number of lithographic or nanoscale wires $A_0 \ldots A_3$ and a large number of nanoscale wires 150. Although it is difficult to control exactly which nanoscale wire codes appear in a single array or how they are aligned, a high probability of uniqueness is achieved by randomly selecting nanoscale wires from a sufficiently large code space (over 99% easily achievable). The addresses do not have to be entirely unique for this application. Redundancy will provide a tighter code space as shown in U.S. Provisional Patent Application 60/553,865, which is incorporated herein by reference in its entirety. The oxide layer between the $A_0$-$A_3$ wires and the sublithographic wires is not shown for clarity purposes.

The placement of a defined voltage Va on nanoscale wire 190 can be accomplished as follows through the depicted programming structure 160. Applying voltage Va to lithographic or nanoscale wires 180, $A_2$ and $A_3$ and applying 0 (Gnd) voltage to lithographic or nanoscale wires $A_0$ and $A_1$ will allow the voltage Va from lithographic or nanoscale wire 180 to propagate through nanoscale wire 190 only, due to the presence of doped control regions 170 on the nanoscale wire 190 in correspondence with lithographic or nanoscale wires $A_0$ and $A_1$. However, voltage Va will not propagate through the rest of nanoscale wires 150 due to the presence of doped control regions 170 in correspondence with lithographic or nanoscale wires $A_2$ and $A_3$. This process is discussed in further detail in U.S. patent application Ser. No. 10/627,405, which is incorporated herein by reference in its entirety.

Crosspoints 401 with programmable ON-OFF devices 390, for example diodes or any non-volatile device with directional or bidirectional current flow, in a crossbar array 360, 370 provide a programmable OR plane 360, 370. Each output nanoscale wire 380 in either of the OR planes 360, 370 can be programmed to perform the OR of its set of inputs. That is, there is a low resistance path between the input nanoscale wires 210 and the output nanoscale wires 410 only where the crosspoints 401 are programmed into the "on" position. If any of those input nanoscale wires 210 are high, they will be able to deliver current through the "on" crosspoint 401 and pull the output nanoscale wires 410 to a high value.

In view of the fact that the concept for OR planes 360 and 370 is the same, only operation of the OR plane 360 will be discussed in further detail.

According to the present disclosure, during programming of the sublithographic PLA, the nanoscale wires 210 are electrically connectable with nanoscale wires 380 through the ON-OFF devices 390. The nanoscale wires 210 form the inputs of the OR plane 360. In particular, the OR plane 360 allows the inputs along the 'vertical' nanoscale wires 210 to be OR-ed there between, according to the logic function that has to be implemented on the PLA. For example, if the inputs on the 'vertical' nanoscale wires 270 and 271 have to be OR-ed on the 'horizontal' nanoscale wire 410, the leftmost two diodes 391 and 392 will be ON, and the remaining diodes in the same row will be OFF. The nanoscale wires 210 are doped heavily enough so that the crossed horizontal nanoscale wires 380 do not affect their conduction. The OR plane 360 provides outputs 420. FIG. 1A also shows an ohmic contact 430 set to a voltage source Vh and a field-effect junction 440 connected to a voltage source Vi. Although only the operation of the OR plane 360 is discussed, the outputs 420 comprise inputs from both sets of restoration nanoscale wires 210 and 320.

Figure 2:
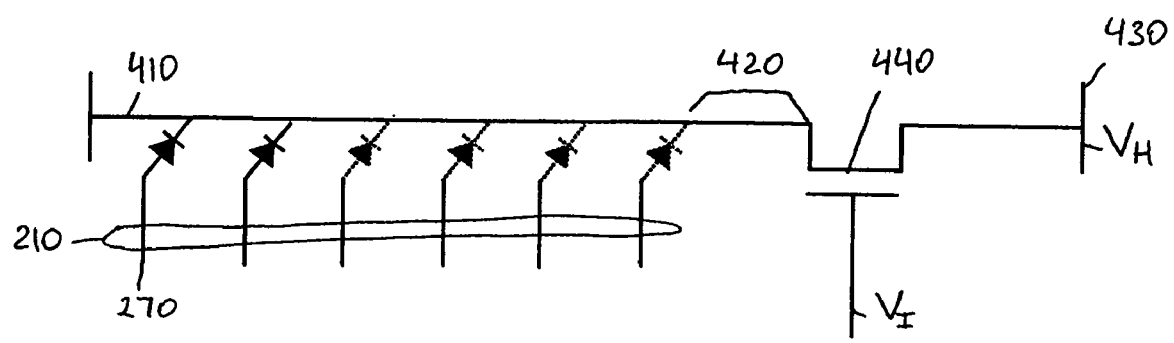
FIG. 2 depicts a unit equivalent electric circuit of the OR plane.

FIG. 2 shows the unit equivalent circuit 400 of a portion of the OR plane 360 of FIG. 1A. In FIG. 2, the ON-OFF devices which have been programmed ON are shown in solid lines, while the ON-OFF devices which have been programmed OFF are shown in dotted lines. Referring to circuit 400 in FIG. 2, if the input to the OR plane 360, any of the nanoscale wires 210, is high, this couples through any "ON" diode points and pulls the associated diode output lines 410 high. The strong pullup is ratioed appropriately with the weak pulldown 440 so that the pullup can drive the outputs to suitably high output voltages. Vi is used to make 440 a weak pullup. If all the inputs to the OR plane 360, nanoscale wires 210 with programmed on junctions 391, 392 are low, the succeeding ON-OFF device plane cannot be-pulled high.

The input nanoscale wires 210 to the nanoscale wire 410 can only pull the line up. To evaluate a logic function (an OR) on nanoscale wire 410, the input must be allowed to be move up or down. Ohmic contact 430 can be set to a low value (e.g. ground) and can pull the line to ground. The ON-OFF devices, however, are weak and cannot pull nanoscale wire 410 very high if the nanoscale wire 410 is being pulled to ground by a strong, microscale ohmic contact 430. The FET controlled by field-effect junction 440 allows to control the effective resistance between Vh and the nanoscale wire 410. By making the effective resistance a moderately high resistance the FET acts as a weak, static pulldown resistor; alternately, by changing the value on Vi, the Vh is effectively disconnected from the output 420. A typical use, will be to pre-discharge the line by enabling conduction to ground at ohmic contact 430. Then, Vi is used to isolate ohmic contact 430 from output 420. Further, the input nanoscale wires 210 are allowed to charge or not charge line 410. If any of the input nanoscale wires 210 are high, nanoscale wire 410 is charged high. If none of the input nanoscale wires 210 are high, nanoscale wire 410 is left low (where it is discharged through ohmic contact 430). This set up allows the nanoscale wire 410 to be reset after a cycle where the output 420 of the logic is high back to a zero so that the nanoscale wire 410 can have value zero if that is the appropriate logical output on the following cycle.

According to the present disclosure, the sublithographic PLA could be programmed to perform an AND function as shown in FIG. 1B. The nanoscale wires 210 are electrically connectable with nanoscale wires 380 through the ON-OFF devices 390. The nanoscale wires 210 form the inputs of the AND plane 361. In particular, the AND plane 361 allows the inputs along the 'vertical' nanoscale wires 210 to be AND-ed there between, according to the logic function that has to be implemented on the PLA. The nanoscale wires 210 are doped heavily enough so that the crossed horizontal nanoscale wires 380 do not affect their conduction. The AND plane 361 provides outputs 420. Although only the operation of the AND plane 361 is discussed, the outputs 420 comprise inputs from both sets of restoration nanoscale wires 210 and 320.

The AND plane 361 in FIG. 1B is set up differently than the OR plane 360 in FIG. 1A. For example, the output nanoscale wires 380 in FIG. 1B are P-type and the nanoscale wires 210 in FIG. 1B are N-type. The outputs 420 of the AND plane in FIG. 1B are charged high instead of low as discussed above for the OR plane 360. Further, the inputs nanoscale wires 150 and nanoscale wires 210 in FIG. 1B are charged high instead of low as discussed above for the OR plane 360. If any of the nanoscale wires 210 in FIG. 1B are low, the output 420 will be low. If all of the nanoscale wires 210 in FIG. 1B are high, then the output 420 remains high.

However, ON-OFF devices 390, as shown in FIG. 1A, alone do not provide arbitrary or cascadable logic. The OR gates are not universal logic building blocks. With ON-OFF devices 390 alone, the signals cannot be inverted which is necessary to realize arbitrary logic. Further, whenever an input is used by multiple outputs, the current is divided among the outputs; this cannot continue through arbitrary stages as it will eventually not be possible to distinguish the divided current from the leakage current of an "off" crosspoint 401. The ON-OFF devices 390 junction may further provide a voltage drop at every crosspoint 401 such that the maximum output high voltage drops at every stage.

The limitations of ON-OFF logic noted above are overcome by inserting rectifying field-effect restoration planes 110, 120 before OR planes 360, 370, as shown in FIG. 1A. In particular, restoration plane 110 carries logic signals which are inverted version of the inputs, while restoration plane 120 carries logic signals which are a true version of the inputs. The inputs to the structure of FIG. 1A are represented by the nanoscale wires 150, which can be stochastically assembled and addressed, as explained above.

The restoration plane 110 comprises an inversion array 130. The restoration plane 120 comprises a buffer or non-inverting array 140. The restoration plane 110 also comprises microscale contacts 230, 240 and field-effect junctions 260, 265. The restoration plane 120 also comprises microscale contacts 290, 300 and field-effect junctions 310, 315. The microscale contacts 230, 240, 290 and 300 allow supply voltage to be provided to the restoration planes 110, 120 and field-effect junctions 260, 265, 310, 315 provide control voltages to the restoration planes 110, 120 as explained later in more detail. The non-inverting restoration plane 120 provides a true logic signal through the buffer array 140 and the inverting restoration plane 110 provides a complement logic signal through the inversion array 130. Although the buffer array 140 and inversion array 130 are usually identical, the function of the buffer array 140 and inversion array 130 is controlled by properly setting up the supply and control voltages through the ohmic contacts 230, 240, 290, 300 and field-effect junctions 260, 265, 310, 315, respectively.

Besides providing the true and complement of a logic signal, the restoration arrays 110 and 120 also provide restoration of the logic signals. Signal restoration allows high signals to be driven higher and low signals to be driven lower, in order to allow an arbitrary number of devices to be cascaded together and a logical distinction between a low logical value and a high logical value to be maintained. Reference can be made, for example, to U.S. patent application Ser. No. 10/347,121, which is incorporated herein by reference in its entirety.

In accordance with the embodiment of FIG. 1A, the restoration plane 110 comprises nanoscale wires 210. The nanoscale wires 210 are arranged into an array. Each nanoscale wire 210 is coded so that it comprises an axially distributed controllable region 220 that is roughly the width of one of the crossed wires 150 which form the restoration inputs. The remaining portion of each nanoscale wire 210 is doped heavily enough so that the crossed nanoscale wires 150 do not affect the conduction of each nanoscale wire 210.

An ideal restoration plane 110 would be an array of nanoscale wires where each of the nanoscale wires 210 restored a different one of the nanoscale wires 150 which crossed it. Although selection and placement of restoration nanoscale wires 210 into a restoration plane 110 is not precise, a useful restoration plane 110 can still be defined using stochastic population technique. That is, batches of nanoscale wires are coded with control regions in the appropriate places for each of the input locations. After mixing the nanoscale wires together, the nanoscale wires are randomly selected to go into the restoration plane 110. This gives a random selection of code wires. A table in FIG. 3 summarizes how many of the input lines will be restored given that there are $N_{inputs}$ nanoscale wires 150 and there are $N_{restore}$ nanoscale wires 210 in the restoration plane 110. For example, FIG. 3 shows that if there are 100 input nanoscale wires 150 and there are 100 randomly select restoring nanoscale wires 210, it should be expected that 56 different input nanoscale wires 150 would be restored.

Figure 4:
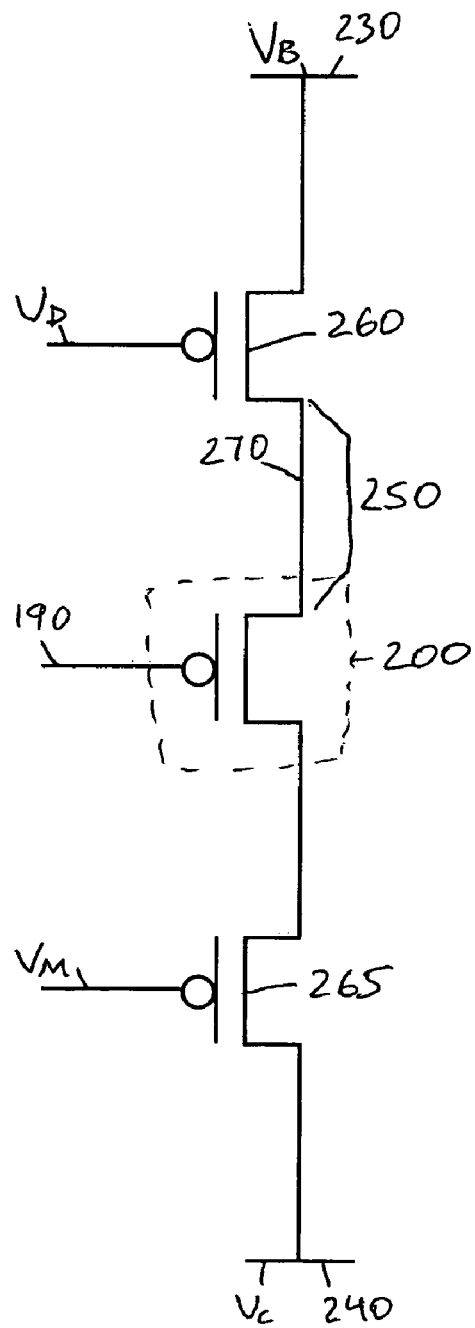
FIG. 4 depicts a unit equivalent electric circuit of the restoration plane.

FIG. 4 shows the unit equivalent electric circuit of the restoration plane 110 referred to a single nanoscale wire 270. In particular, the voltages on contacts 230, 240 are represented by values Vb and Vc, respectively, and the FET behavior of the field-effect junctions 260, 265 is represented by values Vd and Vm, respectively.

The non-inverting restoration plane 120 comprises nanoscale wires 320 that are arranged into an array. Each nanoscale wire 320 is coded so that it comprises an axially distributed controllable region 330 that is roughly the width of one of the crossed nanoscale wires 150 which form the restoration inputs. The remaining portion of each nanoscale wire 320 is doped heavily enough so that the crossed nanoscale wires 150 do not affect the conduction of each nanoscale wire 320.

An ideal restoration plane 120 would be an array of nanoscale wires where each of the nanoscale wires 320 restored a different one of the nanoscale wires 150 which crossed the plane. Although selection and placement of restoration nanoscale wires 320 into a restoration plane 120 is not precise, a useful restoration plane 120 can still be defined using stochastic population technique. That is, batches of nanoscale wires are coded with control regions in the appropriate places for each of the input locations. After mixing the nanoscale wires together, the nanoscale wires are randomly selected to go into the restoration plane 120. This gives a random selection of code wires.

Figure 5:
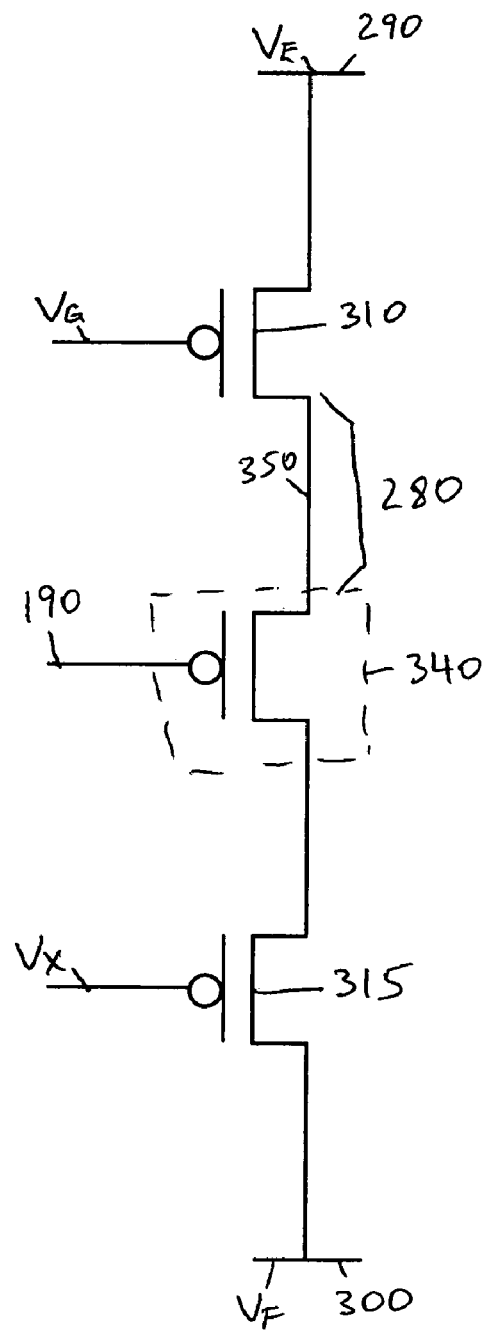
FIG. 5 depicts a unit equivalent electric circuit of the restoration plane.

FIG. 5 shows the unit equivalent electric circuit of the restoration plane 120. In particular, the voltages on contacts 290, 300 are represented by values Ve and Vf, respectively, and the FET behavior of the field-effect junction, 310, 315 is represented by a values Vg and Vx, respectively.

With reference to the inverting restoration plane 110, inverted restored outputs 250 are obtained by means of the array 130 and voltage on the ohmic contacts 230, 240 set to Gnd and Vhigh, respectively.

In particular, restoration plane 110 acts as a voltage divider between the ohmic contact 240 (set at a voltage Vhigh) and the ohmic contact 230 (set at ground voltage). The voltage divider comprises, in sequence, with reference to each nanoscale wire 210, from the bottom to the top of one of the nanoscale wires 270 of FIG. 1A, a voltage source Vhigh, a pull-up resistance Rpu formed by the doped nanoscale region 220, an output region 250, an Rpd resistance controlled by the load field-effect junction 260 at Vpd voltage, and a ground voltage on the ohmic contact 230. Therefore, the person skilled in the art will notice that the voltage at the output region 250 is:

$$Vout = \frac{Vhigh \times Rpd}{Rpd + Rpu}$$

The pull up resistance Rpu is controlled by the input signal, i.e. one of the nanoscale wires 150. If the input signal is high, Rpu is very high (depletion mode, P-type case). If the input signal is low, Rpu is low. Vpd on the field-effect junction 260 is set so that Rpd is large compared to the low voltage Rpu resistance and small compared to the high voltage Rpu resistance, that is $Rpu$(high voltage)$\gg Rpd(Vpd) \gg Rpu$(low voltage).

If the input voltage is low, Rpu is low, and Vout is driven close to Vhigh. On the other hand, if the input voltage is high, Rpu is high and Vout is driven close to Gnd. Therefore, the structure act like an inverter.

FIG. 6 shows the unit equivalent circuit of the above discussed voltage divider, with applied voltages Vhigh and Vpd. Referring to circuit in FIG. 6, if the input to the inverter, nanoscale wire 190, is high, it depletes carriers in the depletion-mode p-type nanowires and cuts off conduction. As a result, the nanoscale wire 270 is connected only to the weak pull down resistance Rpd and Vout is held low. When the input to the inverter, nanoscale wire 190, is low, there is current flow through the gate and the Vout is pulled high.

Figure 7:
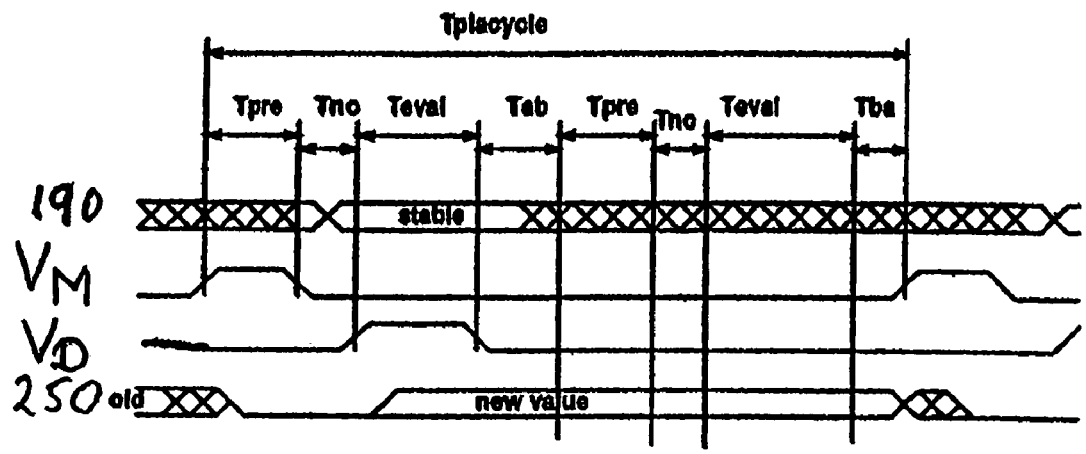
FIG. 7 depicts timing diagram of a unit equivalent electric circuit in FIG. 6.

As stated above, the conduction through controllable region 220 can be controlled via an electrical field like a Field-Effect Transistor (FET). This is demonstrated by a crosspoint 200 as depicted in FIG. 6. As fully described above, when the input to the nanoscale wire 190 is low, there is current flow through the gate at the crosspoint 200 and the Vout is held high. To prepare the output 250 for the next input from the nanoscale wire 190 the Vout must be reset to low. This is performed by grounding Yd and setting Vm high to discharge the output 250, as shown in the timing diagram of FIG. 7. As long as Vm is high, there is no current flow from the Vhigh to the Vout even if the input nanoscale wire 190 is set low. When it is time to evaluate the next input from the nanoscale wire 190, Vm is set low, at which point if the nanoscale wire 190 is set low the current will flow to the output 250 and pull it up. If, however, the nanoscale wire 190 is high, the current will not flow to the output even though Vm is allowing the conduction. Vm performs two things: 1) it makes sure that the current flow path to the high supply is off while Vd is low, this allows quick discharge and saves power; 2) it provides timing control when it is time evaluate the input from the nanoscale wires 150.

Similar considerations apply to the non-inverting restoration plane 120, where non-inverted buffered restored outputs 280 are obtained by means of the array 140 and voltage on the ohmic contact 290, 300 set to Vhigh and Gnd, respectively.

In particular, restoration plane 120 acts as a voltage divider between the ohmic contact 290 (set at a voltage Vhigh) and the ohmic contact 300 (set at ground voltage). The voltage divider comprises, in sequence, with reference to each nanoscale wire 320, from the bottom to the top of one of the nanoscale wires 350 of FIG. 1A, a voltage source Gnd, a pull-down resistance Rpd formed by the doped nanoscale region 330, an output region 280, an Rpu resistance controlled by the field-effect junction 310 at Vpu voltage, and a Vhigh voltage on the ohmic contact 290. Therefore, the person skilled in the art will notice that the voltage at the output region 280 is:

$$Vout = \frac{Vhigh \times Rpd}{Rpd + Rpu}$$

The pull down resistance Rpd is controlled by the input signal, i.e. one of the nanoscale wires 150. If the input voltage is high, Rpd is high, and Vout is driven close to Vhigh. Therefore, the structure does not act like an inverter.

FIG. 8 shows the unit equivalent circuit of the above discussed voltage divider, with applied voltages Vhigh and Vpd. The non-inverting buffer circuit in FIG. 8 behaves in a manner which is opposite to inverting circuit in FIG. 6. By taking Vout from the Vhigh side of the buffer input gate, the Vout is coupled to Vhigh when buffer input, nanowire 190, is high and Vout is coupled to the Gnd when buffer input, nanowire 190, is low.

Figure 9:
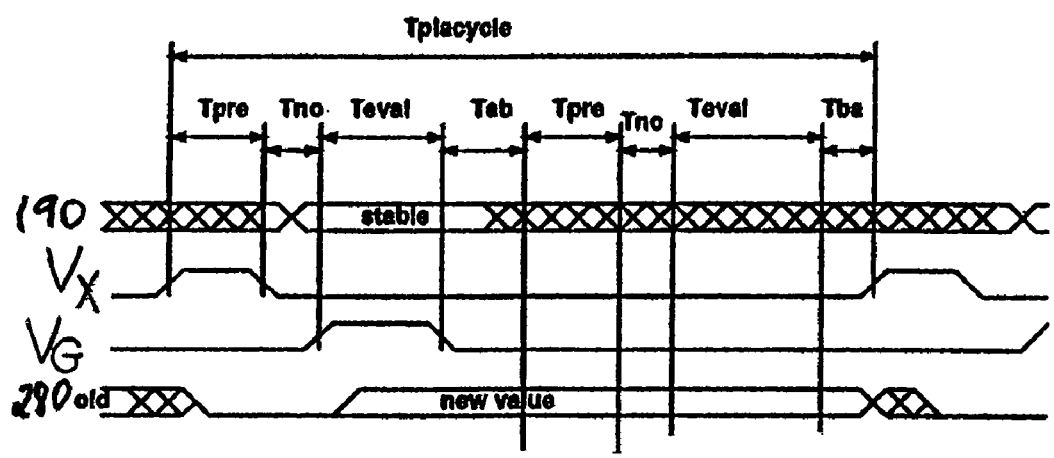
FIG. 9 depicts timing diagram of a unit equivalent electric circuit in FIG. 8.

As stated above, the conduction through controllable region 220 can be controlled via an electrical field like Field-Effect Transistors (FETs). This is clearly demonstrated by the crosspoint 340 as depicted in FIG. 8. As fully described above, when the input to the nanoscale wire 190 is low and Vx is low, there is current flow through the gate at the crosspoint 340 and the Vout is pulled low. To prepare the output 280 for the next input from the nanoscale wire 190 the Vout must be reset to high. This is performed by grounding Vg and setting Vx high to charge the output 280, as shown in the timing diagram of FIG. 9. As long as Vx is high, there is no current flow from the Gnd to the Vout even if the input nanoscale wire 190 is set low. When it is time to evaluate the next input from the nanoscale wire 190, Vx is set low, at which point if the nanoscale wire 190 is set low the current will flow from the output 280 and pull it down. If, however, the nanoscale wire 190 is high the current will not flow from the output even though Vx is allowing the conduction. As Vm described above, Vx performs two things: 1) it makes sure that the current flow path to the low supply is off while Vd is low, this allows quick discharge and saves power; 2) it provides timing control when it is time evaluate the input from the nanoscale wires 150.

Figure 10:
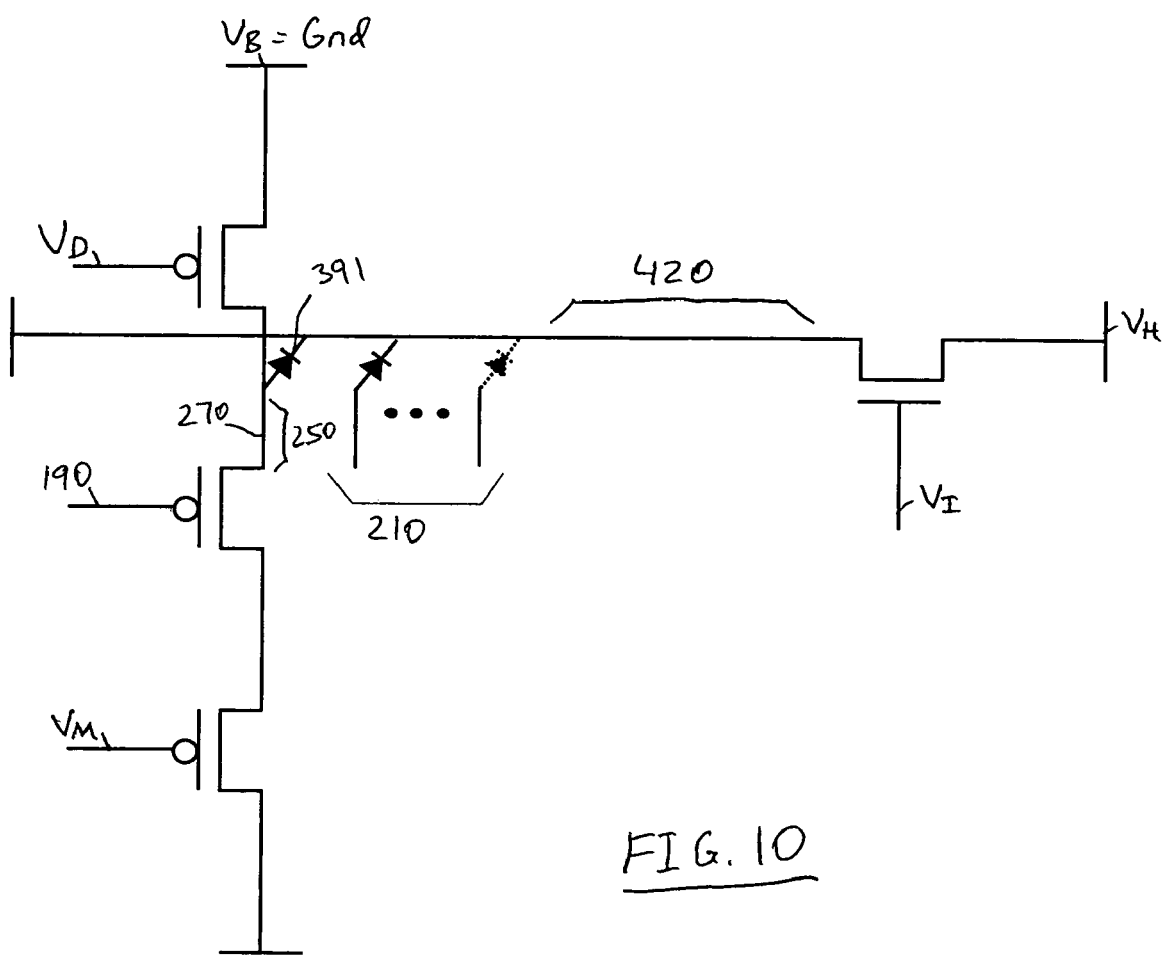
FIG. 10 depicts unit equivalent circuit of inverting plane in series with the OR plane.
Figure 11:
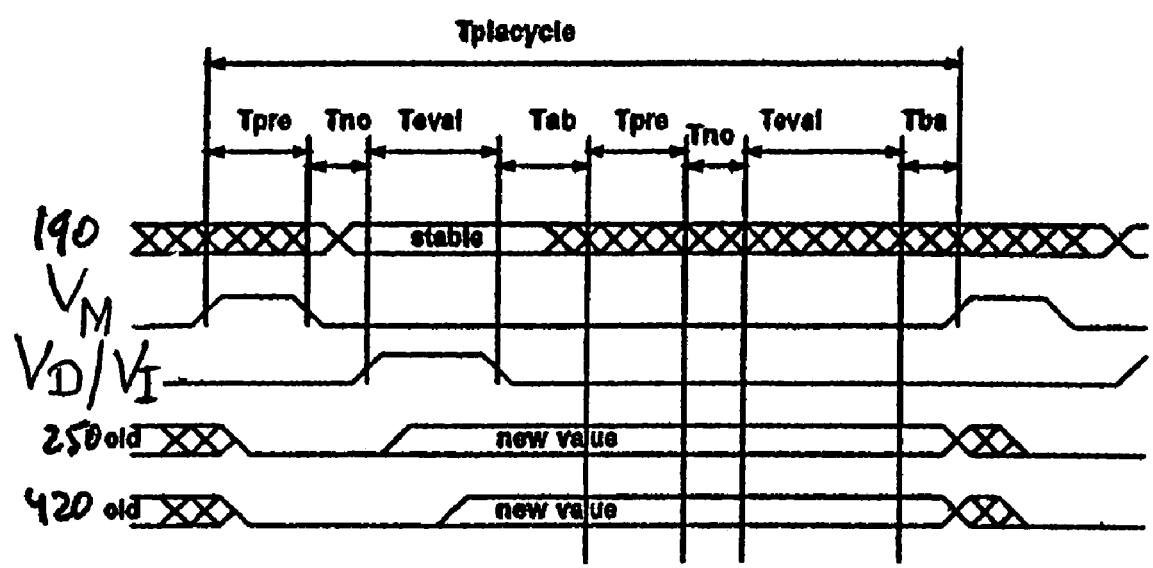
FIG. 11 depicts timing diagram of a unit equivalent electric circuit in FIG. 10.

FIG. 10 shows the unit equivalent circuit discussed above in FIG. 6 in series with the unit equivalent circuit discussed above in FIG. 2. The timing diagram of FIG. 11 depicts how a value on input nanoscale wire 190 propagates through the inverting plane 130, OR plane 360 to the output 420 in the unit equivalent circuit in FIG. 10.

Figure 12:
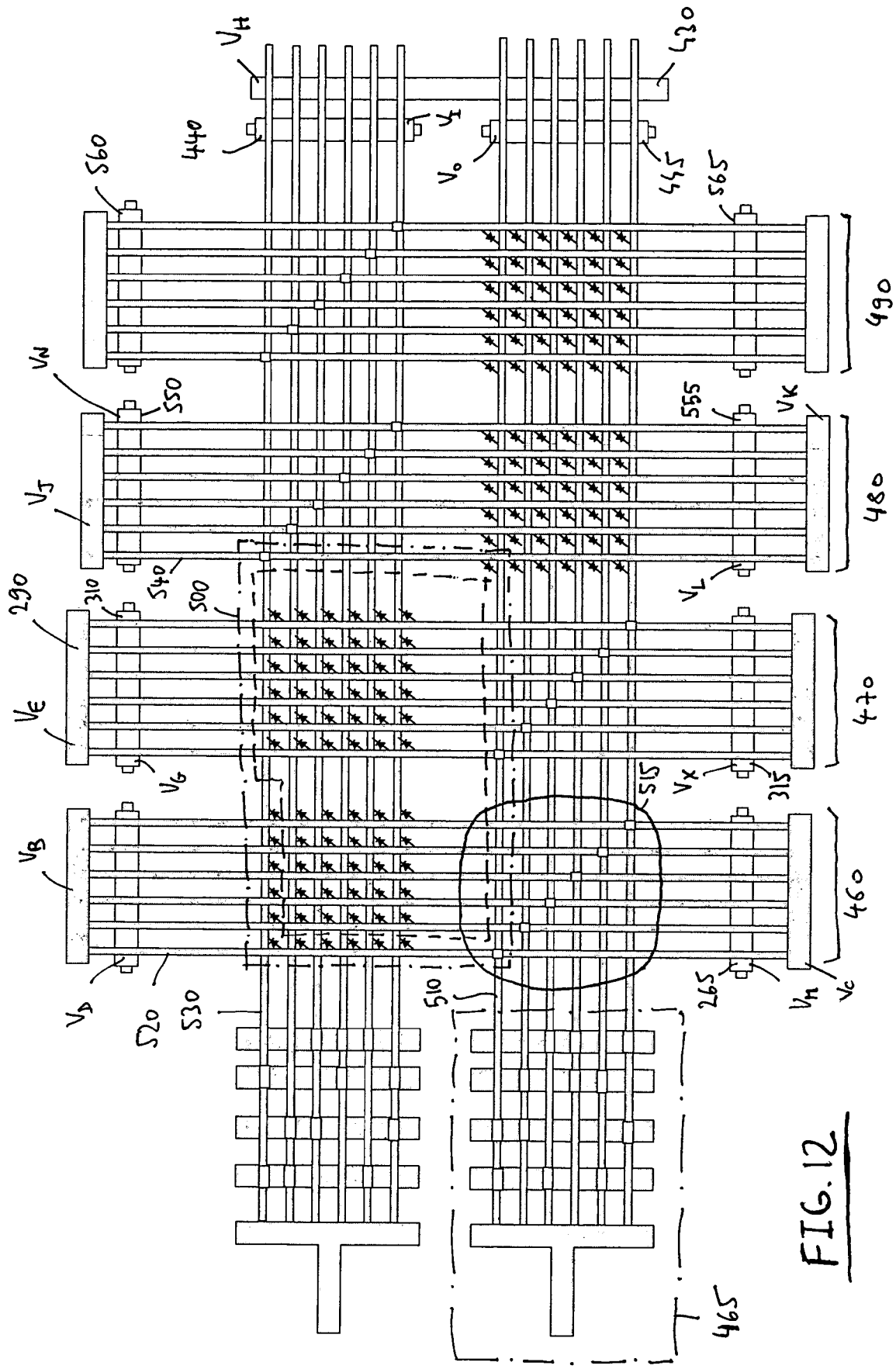
FIG. 12 depicts a two-plane sublithographic PLA.

FIG. 12 is based on the one-plane structure of FIG. 1A and discloses a two-plane structure. The two-plane structure of FIG. 12 comprises four restoring stages 460, 470, 480 and 490. Wherein restoring stages 460 and 480 are inverting stages and restoring stages 470 and 490 are non-inverting stages.

Figure 13:
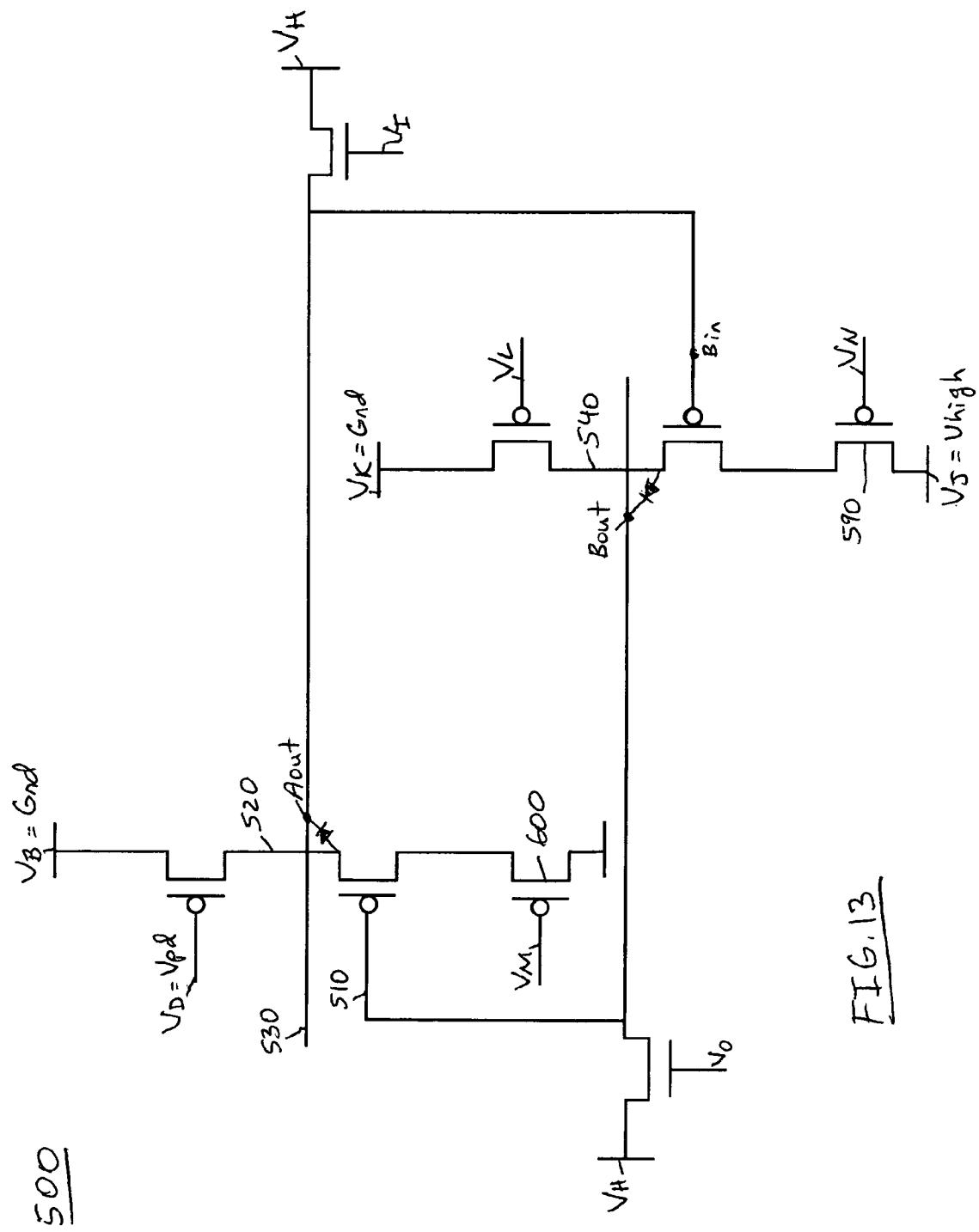
FIG. 13 depicts a unit equivalent electric circuit of the two-plane PLA.
Figure 14:
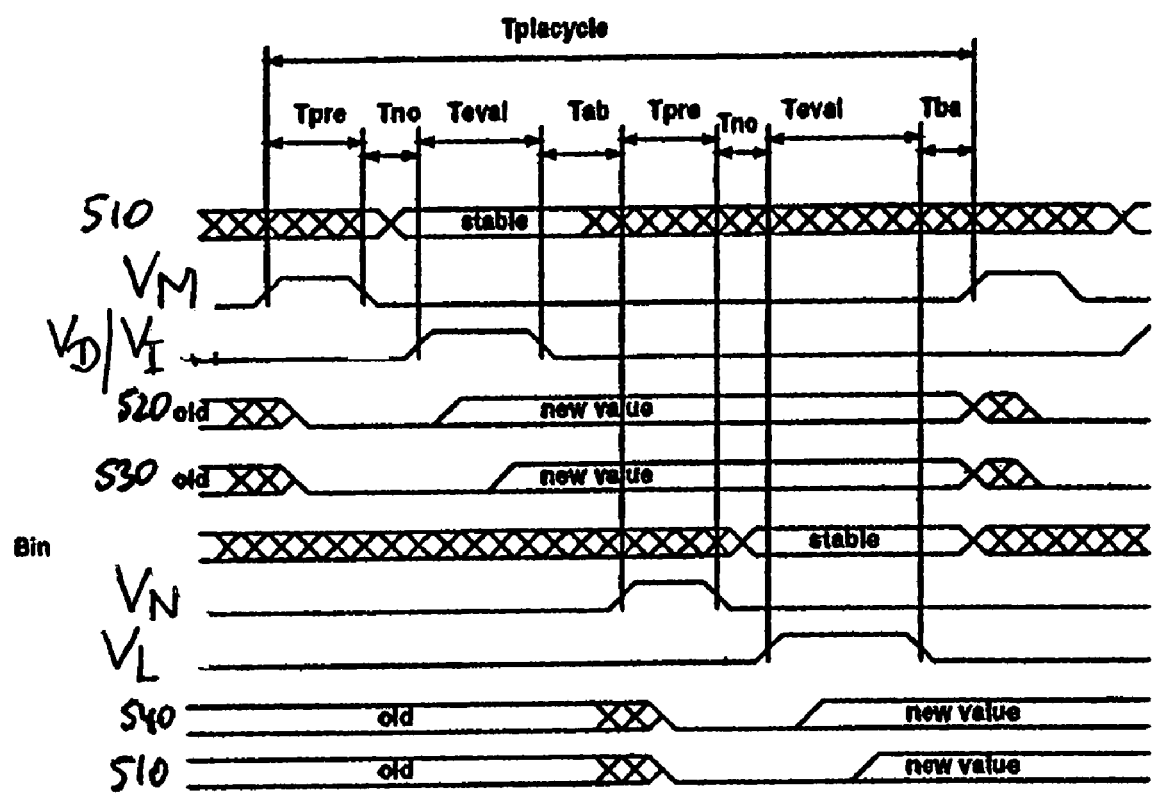
FIG. 14 depicts timing diagram of a unit equivalent electric circuit in FIG. 13.

A unit equivalent circuit 500 of the two-plane PLA is depicted in FIG. 13. The timing diagram of FIG. 14 depicts how a value on input nanoscale wire 510 propagates through the inverting plane 515, OR plane 516, inverting plane 517, OR plane 518 and back to input nanoscale wire 510 in the unit equivalent circuit in FIG. 13.

A person skilled in the art will notice that the cyclic arrangement shown in FIG. 13 and realized by the organization in FIG. 12 can be viewed as a pair of latched gates. The pair of latched gates can be used to provide clocked logic. The separate controls (Vd,Vm, and Ve, Vn) allow the logic to be evaluated in a 2-phase form, similar to a conventional 2-phase clocking scheme. Consequently, the cycle in FIGS. 12 and 13 provides a clocking capability.

Further, one skilled in the art will notice that the above arrangement can be viewed as a programmable NOR-NOR (AND-OR) plane followed by a clocked register. As such, the arrangement can be used to implement clocked logic, including finite-state machines. The PLAs according to the present disclosure are capable of implementing combinational logical functions and implementing finite-state machines.

The area efficiency of the PLAs can also be addressed by optimization techniques such as sharing of programmable decoders among arrays and implementation of logic in more than two levels or planes.

The programming structure 465 can occupy a significant fraction of the area of the nanoPLA. Notably, if the structure allows addressing from microscale wires, the large pitch of the microscale wires relative to the nanoscale wires in the array, will, as a consequence, increase the dimension of the programming structure. However, a large dimension of the programming structure is tolerable with large nanoPLAs, i.e. PLAs having a large number of wires in the 460, 470, 480, 490 columns.

Figure 15:
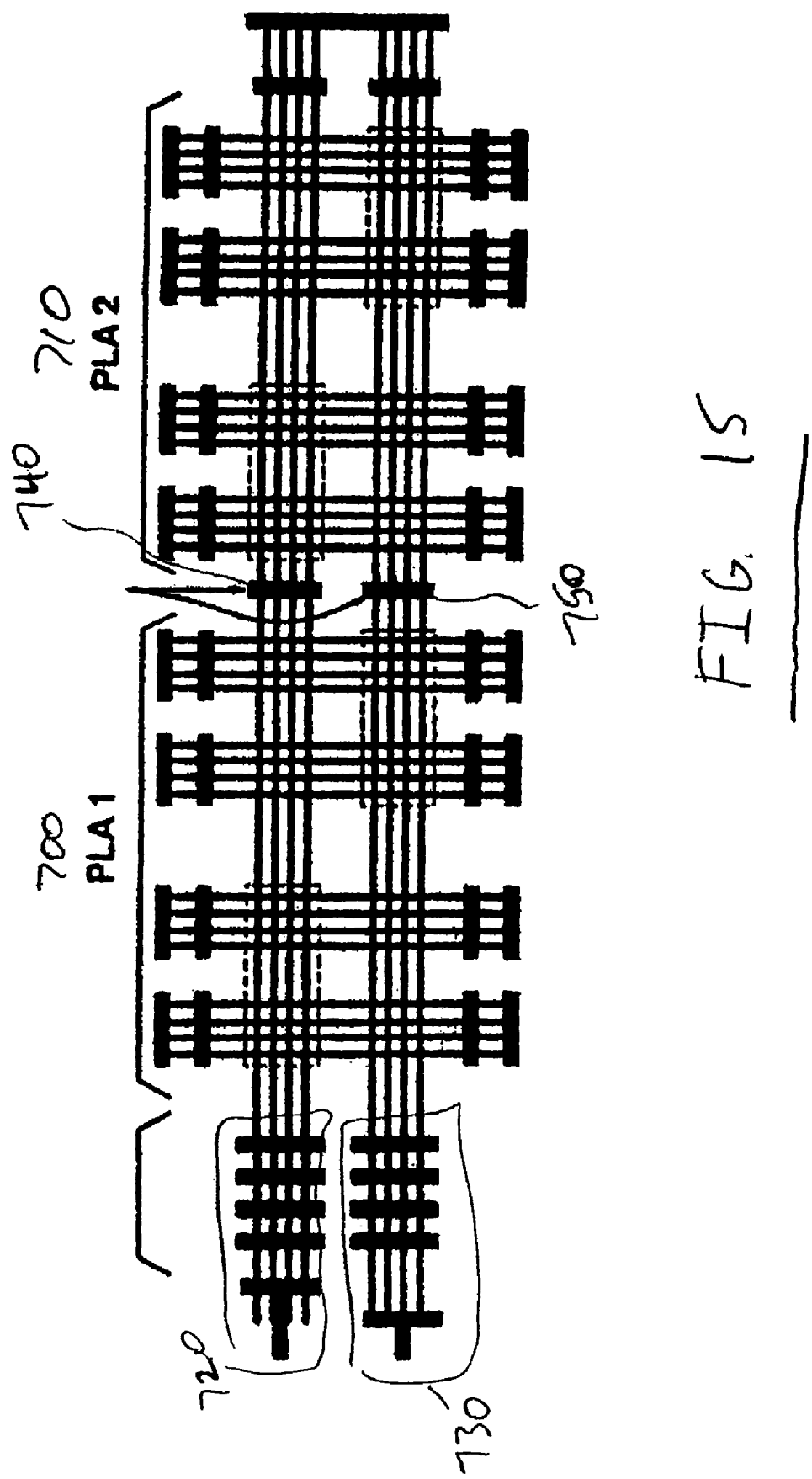
FIG. 15 depicts two two-plane sublithographic PLAs sharing the same programming structure.

Alternatively, the programming structure can be shared among multiple nanoPLAs. Referring to FIG. 15, two two-plane PLAs 700 and 710 can share the same programming structures 720 and 730. Isolation transistors 740 and 750 serve to electrically separate the row segments of the planes during operation. However, during programming, the isolation transistors 740 and 750 allows the programming structures 720 and 730 to address all of the PLAs. In the embodiment of FIG. 15, all rows on the same phase can be pulled down simultaneously. A single supply connection can be used to set all of the rows low simultaneously, then isolate the rows for the next logic evaluation. This will allow to put charge on all the individual segments of such a shared group of wires (and there could be more than 2 groups sharing the programming and precharge lines) 1) during programming, and 2) during precharge. During the rest of time the isolation transistors 740, 750 are used to keep the OR functions independent. Preferably, all segments will be be precharged at once, i.e. at the same time and all to the same value. So, during the precharge phase, the isolation transistors 740, 750 are set to allow conduction and precharge everyone. After all segments are pulled low, the isolation transistors 740, 750 are used to isolate the segments.

A second option for area reduction is to compute using multiple levels of logic. It is well known that many common functions require an exponential number of product terms when forced to two-level form, whereas the functions can be implemented in a linear number of gates (e.g. XOR). Research on optimal PLA block size to include in conventional, lithographic FPGAs suggests PLA blocks contain modest (e.g. 10) product terms and programmable interconnect. However, the fact that it is desired to amortize out the lithographic programming lines to get the benefits of sub-lithographic PLAs will likely shift the beneficial PLA size to larger numbers of product terms.

According to the present disclosure, at least two options are available that can be used to spread PLA evaluation over multiple planes to avoid unreasonable growth in product term requirements.

1. creating physical cycles containing more than two PLA planes
2. looping evaluation around the physical planes in a cycle more than once (on top of the first scheme of possibly using more than two planes).

According to a first option, PLA cycles are created with S number of stages.

Figure 16:
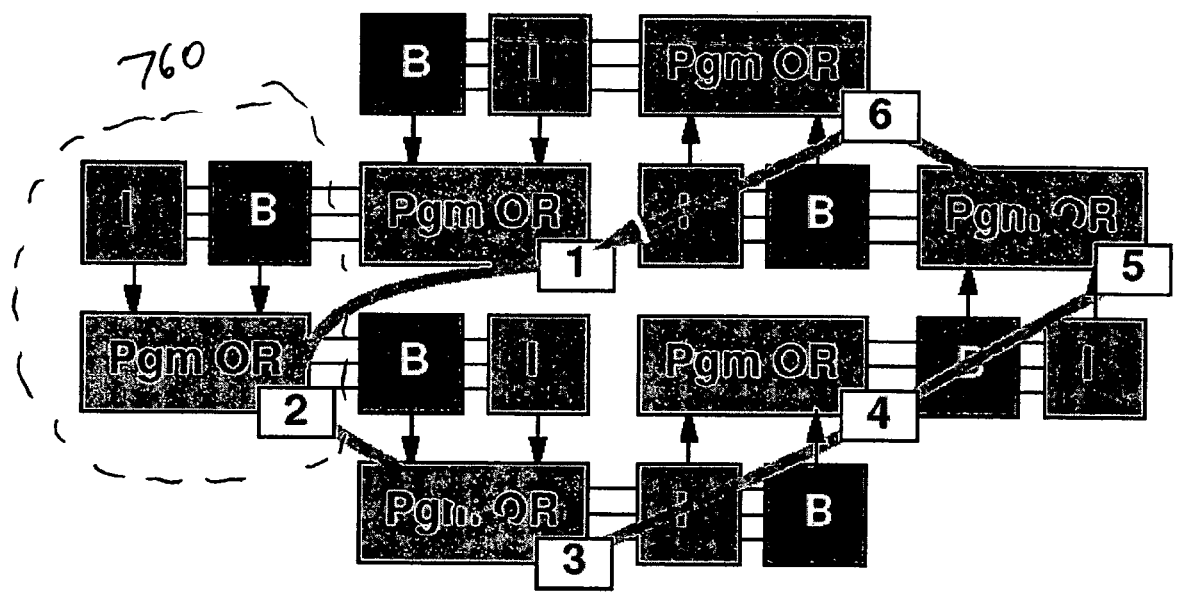
FIG. 16 depicts an array of 6 single-plane PLAs.
Figure 17:
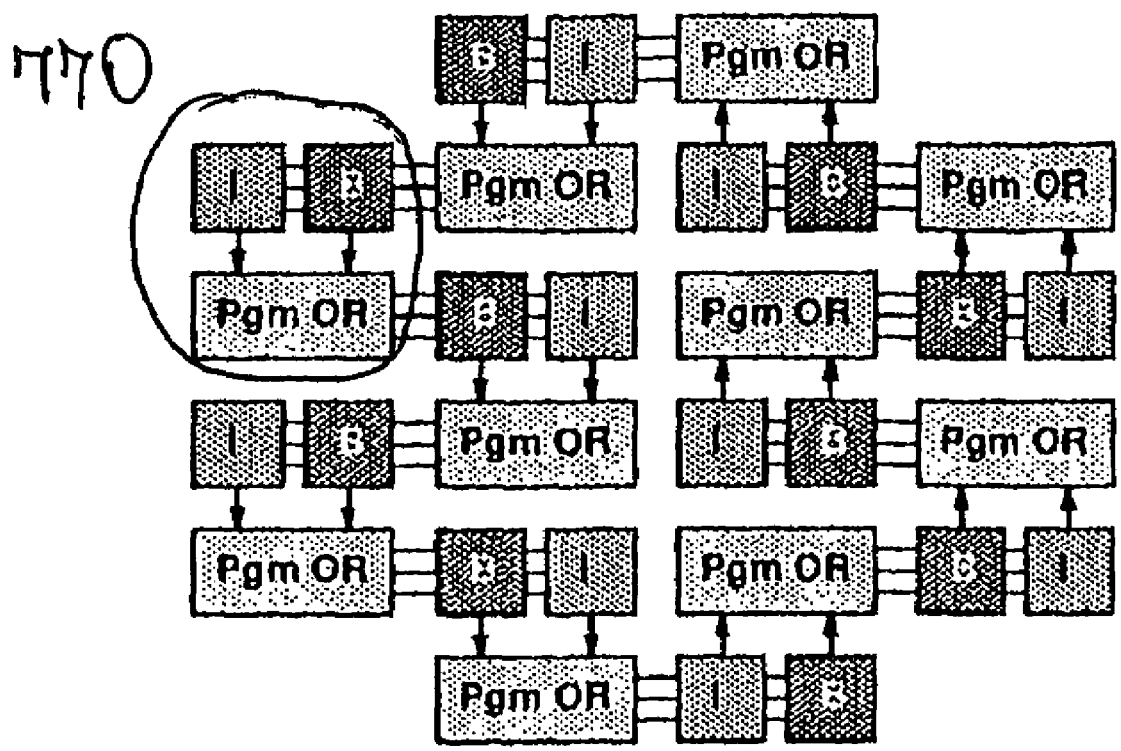
FIG. 17 depicts an array of 10 single-plane PLAs.
Figure 18:
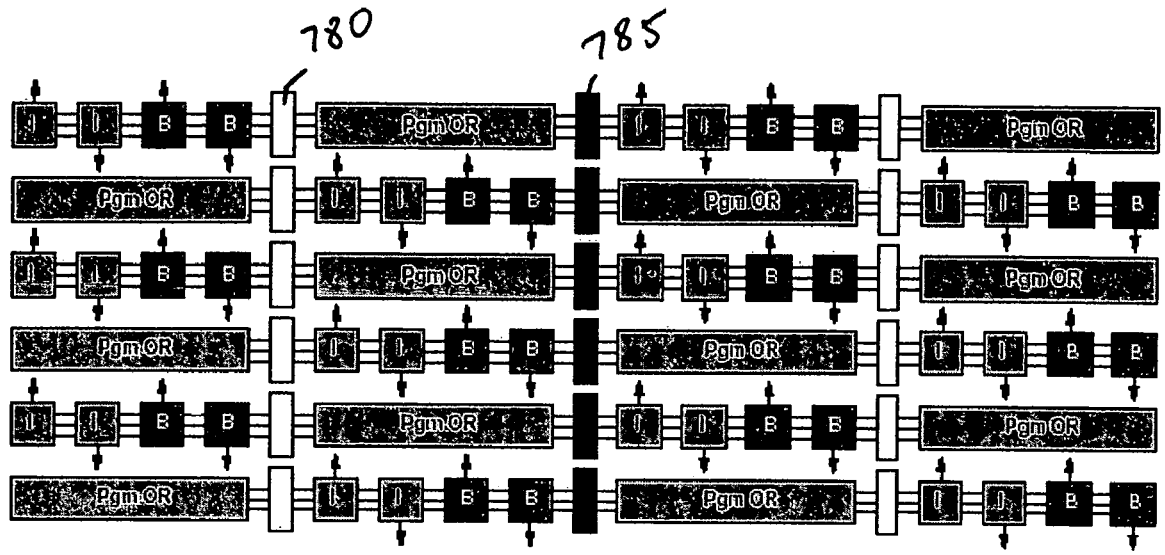
FIG. 18 depicts a large array of single-plane PLAs separated in half.

Referring to FIGS. 16, 17 and 18, the S number of stages can be varied by re-arranging the connections between the single-plane PLAs.

FIG. 16 depicts single-plane PLA 760 in an array of six single-plane PLAs.

FIG. 17 depicts single-plane PLA 770 in an array of ten single-plane PLAs. Structures in FIGS. 16 and 17 consisting of 6, 10, programmable OR plane with a buffering and inverting plane, respectively. Inputs to and outputs from each of these units go horizontally, and communication between each OR plane and its buffering and inverting planes occurs vertically. By feeding the output of one of the units 760, 770 into another unit 760, 770 respectfully, a chain of units can be formed. By feeding some of the outputs of the last unit in a chain of units 760, 770 back into the first unit in the chain, a cycle of length 6, 10 of these PLA planes is formed, respectfully. A person skilled in the art should be able to note that the basic topology embodied here can be adapted to create any cycle of length 2+4n for any integer $n \geq 0$.

Figure 19:
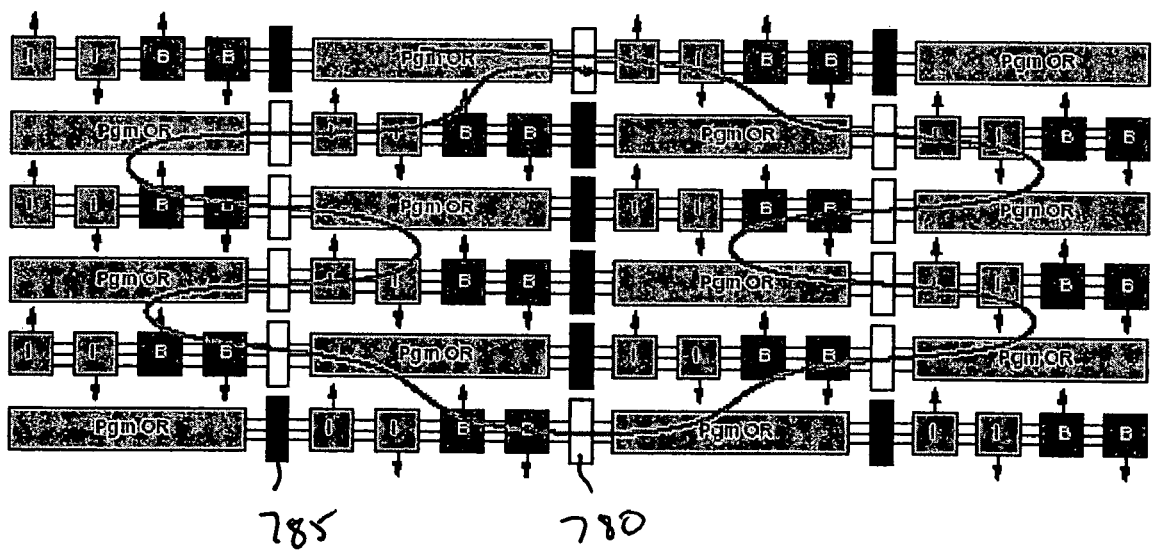
FIG. 19 depicts a large array of single-plane PLAs separated to create a large cycle.

Referring to FIGS. 18, 19, a large array of single-plane PLAs can be constructed using isolation transistors 780, 785 between the stages. By controlling which ones are set into isolation mode and which ones are set into connection mode, it can be determined which nanoscale wire outputs are coupled into which nanoscale wire inputs. This allows post fabrication configuration of cycles of various lengths. In the FIGS. 18, 19 isolation devices 780 are set to pass through, isolation devices 785 are set to disconnect current. The FIG. 18 shows how to set the isolation so that there are two separate halves. Within each half, the OR programming can be used to create various, interleaved 2-plane cycles. As traced out in the FIG. 19, by setting things as shown, a large cycle is created.

According to a second option, the evaluation of some function is looped W times through a set of S stages.

Rather than using a separate physical plane for every logical stage of evaluation in a spread PLA mapping as discussed above, the logic can also be wrapped around the PLA multiple times. For example, a 4-input XOR function is needed to be performed. The XOR function can be performed through a "flat" logic evaluation shown in FIG. 20 or a "wrapped" logic evaluation shown in FIG. 21.

Figure 20:
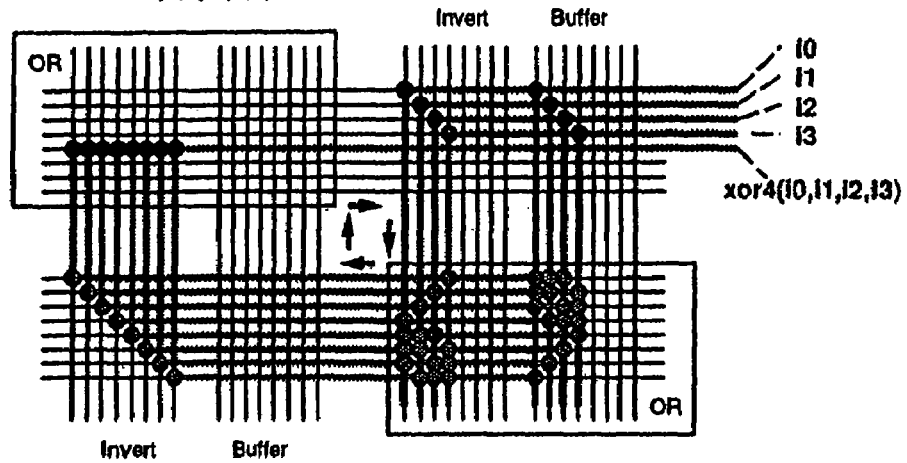
FIG. 20 depicts a PLA implementing "flat" logic evaluation.

Referring to FIG. 20, the flat logic evaluation of the XOR is performed by wrapping the logic through the PLA once. That is computing the function of a 4-input XOR at once. The flow of computation is that inputs enter the upper-right plane, are passed to the lower-right OR plane, are collected by the lower-left plane, are passed to the upper-left OR plane, and the output is finally sent out on a wire from the upper-right plane. The function is not computed "at once" in the sense of instantaneously, but instead is computed with a single pass through the planes of the PLA.

Figure 21:
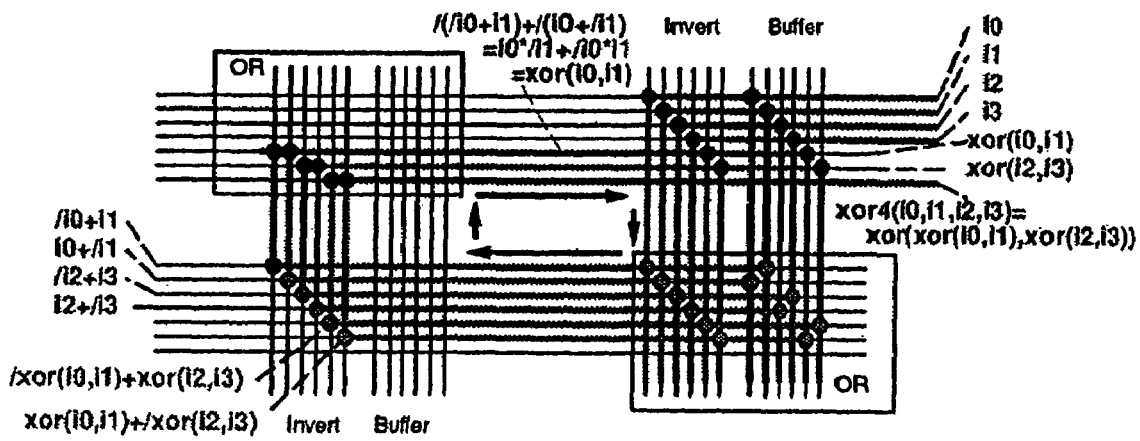
FIG. 21 depicts a PLA implementing "wrapped" logic evaluation.

Referring to FIG. 21, the wrapped logic evaluation of the XOR is performed by wrapping the logic through the PLA twice. That is computing the 4-input XOR as a cascade of two levels of 2-input XORs. The flow of computation is that inputs enter the upper-right plane, are passed through the planes of the PLA as in FIG. 20, but then two intermediary terms are computed (XOR(i0,i1) and XOR(i2,i3)). These two terms are passed around the PLA again in order to compute the final output. In FIG. 21, it takes one cycle through the PLA to compute the intermediary state and then another to compute the final output, whereas in the FIG. 20 the entire function was computed in one trip around the four planes of the PLA.

As a comparison, the wrapped logic evaluation requires six active OR terms for a total of seven OR terms including inputs, outputs, and array feedbacks, whereas the flat logic evaluation requires eight OR terms. That is, as can be seen in FIG. 20 the upper-left, lower-left and lower-right planes have eight connections across either horizontally or vertically. This means that this function may not be implemented on a PLA which has less than eight usable wires in each dimension in each plane. In contrast, the circuit in FIG. 21 has no more than six connections in any dimension except for the I/O on the right side of the upper-right plane (which has seven), thus it may be implemented on PLAs which are smaller or have less usable wires than the circuit in FIG. 20. The benefits of one evaluation versus the other becomes more pronounced as XORs grow larger and deeper wrapping is used.

Some of the nanoscale wires assembled into the PLA according to the present disclosure may be broken.

Therefore, useful preliminary operations will include discovery of:

1. which nanoscale wire addresses are present in the array;
2. which nanoscale wires are non-broken;
3. which nanoscale wire addresses are restored in a non-inverting sense;
4. which nanoscale wire addresses are restored in an inverting sense;

As a further step, the programming of the nanoPLA will be adapted around the manufacturing characteristics individuated in accordance with the previous steps.

The person skilled in the art will note that the structure of the sublithographic PLA according to the present disclosure is advantageous, because the PLA can be probed from the microscale lines and the microscale lines can be used to configure the functional portions of the PLA to implement a defined logic function.

Figure 22:
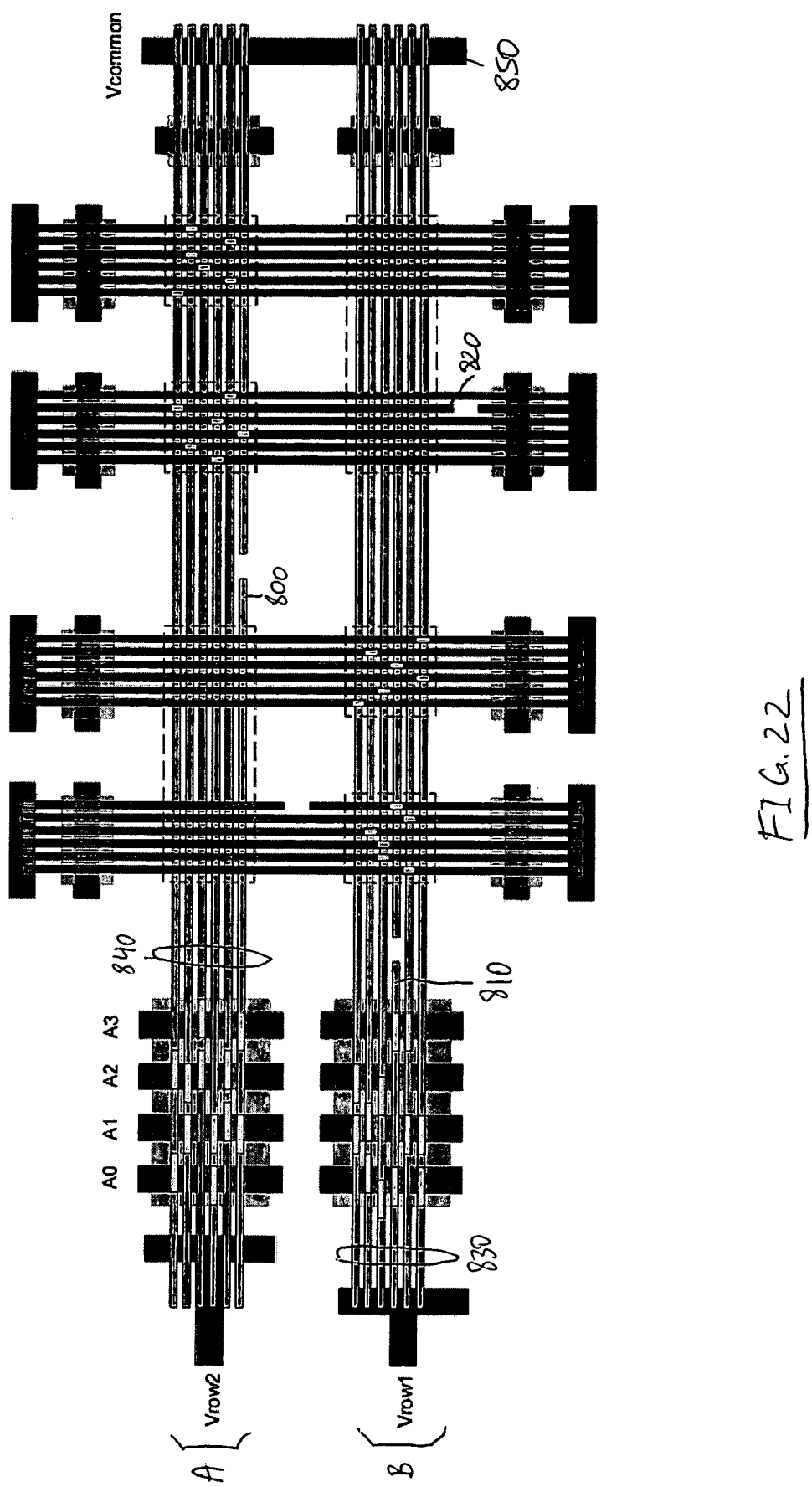
FIG. 22 depicts a PLA performing a 2-input XOR.

The following example illustrates programming of the PLA in FIG. 22 to perform a 2-input XOR. To better illustrate defect handling, three nanoscale wires 800, 810 and 820 are broken as depicted in FIG. 22.

A first step is that of discovering which addresses are present in each of the two planes A and B. Since 4 address lines $A_0 \ldots A_3$ are present for addressing the nanoscale wires 830 and 840, by using a 2-hot code, 6 possible addresses (1100, 1010, 0110, 1001, 0101, 0011) for the OR-terms in each plane need to be tested.

The following steps will be performed to test for the presence of the 6 possible addresses:
1. Drive ohmic contact 850 to ground, then release it.
2. Drive the address lines ($A_0 A_1, \ldots A_3$) to the test address.
3. Drive the common row line Vrow1 or Vrow2 to high.
4. Observe the voltage on the ohmic contact 850.

The ohmic contact 850 will be raised to high only if the test address is present allowing a complete path between Vrow1 or Vrow2 and ohmic contact 850.

Figure 23:
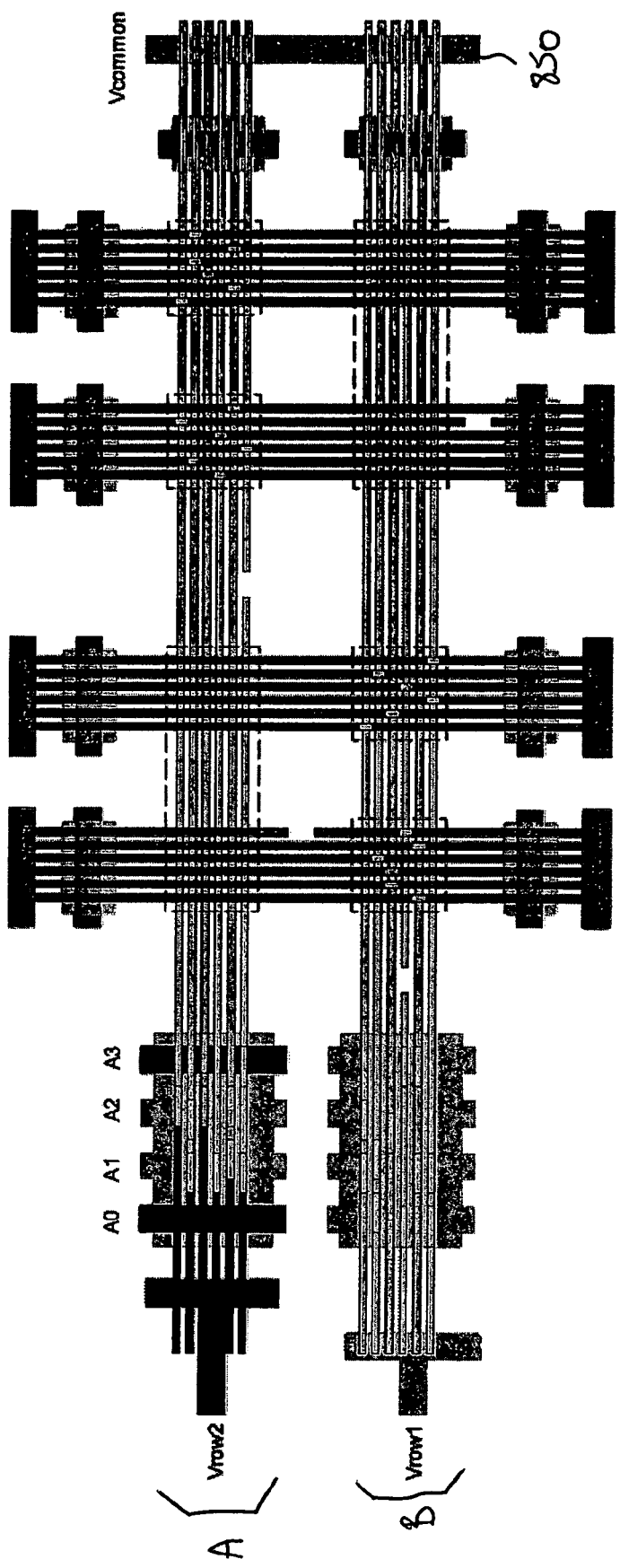
FIG. 23 depicts reading of the address 1001.
Figure 24:
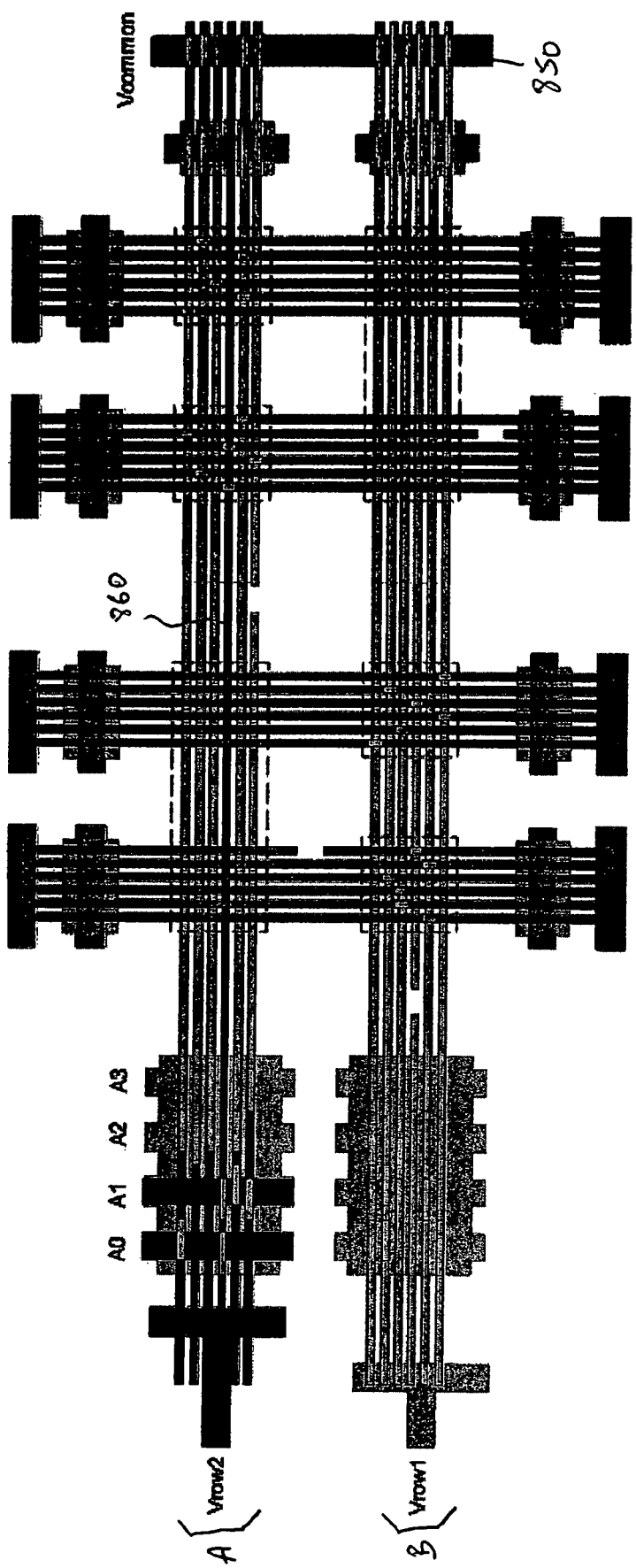
FIG. 24 depicts reading of the address 1100.
Figure 25:
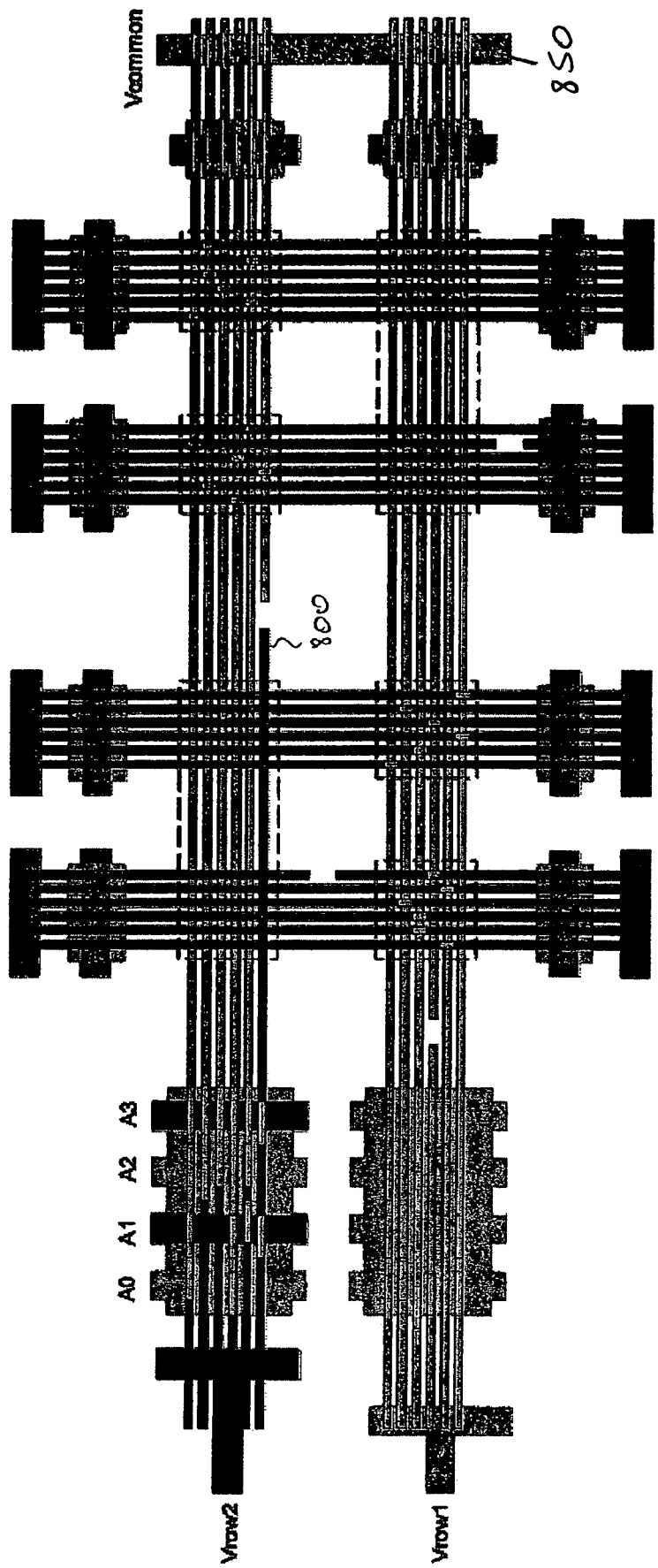
FIG. 25 depicts reading of the address 0101.

FIG. 23 depicts an attempt to read the address 1001 on the plane A. Since the nanoscale wire under address 1001 is not present, this results in no current path from Vrow2 to ohmic contact 850 and ohmic contact 850 remains low. FIG. 24 depicts an attempt to read the address 1100 on the plane A. Since the nanoscale wire 860 has the address 1100 and it is unbroken, this does succeed in raising the voltage on ohmic contact 850. FIG. 25 depicts an attempt to read address 0101 which does not raise ohmic contact 850 since the nanoscale wire 800 has a break in it. After testing all six addresses, the present and functional addresses in the plane A are 1100, 1010, 0110, and 0011. Similar testing for the plane B turns out that the present and functional addresses are 1100, 1010, 0110, and 0101.

Figure 26:
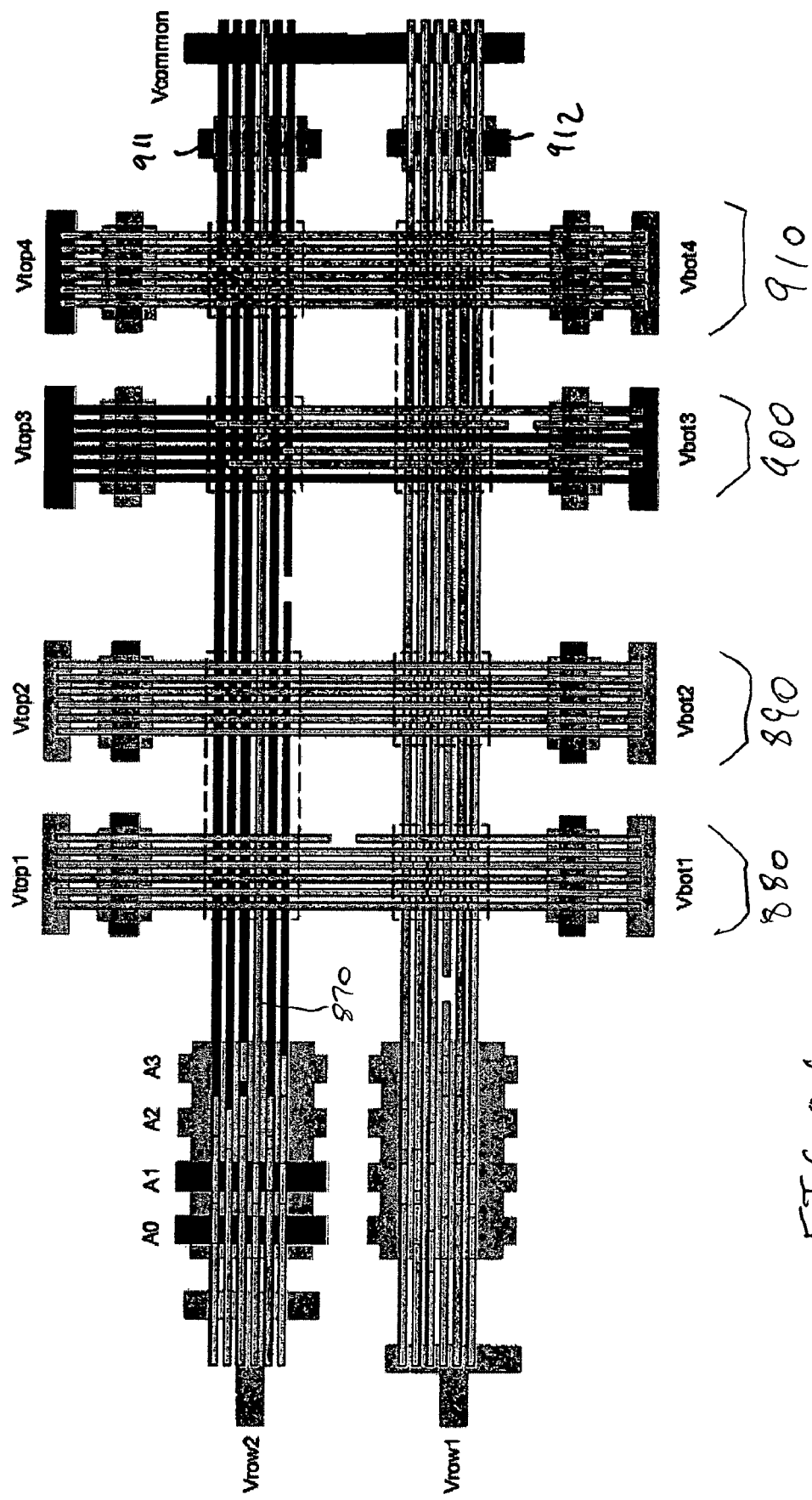
FIG. 26 depicts determining the proper restoration of the signal for a good address.

By knowing which addresses are present, it is possible determine which polarities they provide. Referring to FIG. 26, to determine if the output is restored, each good address is driven to a low voltage, while other nanoscale wires are driven high.

The following steps are performed for each good address:
1. Setting the gate-side supplies on the restoration column (Vtop1 ... Vtop4) to a low voltage.
2. Driving the opposite supplies (Vbot1 ... Vbot4) to a low voltage and release.
3. Using Vcommon, Vrow1 and Vrow2 to precharge all lines to a high voltage, that is drive the precharge devices 911, 912 and all of the addresses $A_0 \ldots A_3$ to high. This allows charging up all of the nanowires to the high voltage, even nanoscale wires with a single break are charged to a high voltage.
4. Releasing Vcommon, Vrow1 and Vrow2 and return the addresses to zeros.
5. Driving the intended address on the address lines.
6. Driving Vrow1 and Vrow2 to a low voltage.
7. After the row line has had time to discharge, driving the gate-side supplies on the appropriate restoration columns (Vtop1 ... Vtop4) to a high voltage.
8. Observing the voltage on the opposite supply (Vbot1 ... Vbot4) once the restoration line has had a chance to charge.

Since the restoration nanoscale wires can be p-type nanoscale wires, a high voltage across their lightly-doped control region will deplete carries and prevent conduction, while a low voltage will allow conduction. In steps 3-6, only the addressed row is low; all other rows are driven to a high value. As a result, conduction will be seen between Vtop and Vbot in a column if the addressed nanoscale wire controls some nanoscale wire in that column.

FIG. 26 depicts the testing of the nanoscale wire 870 under the address 1100. As described above, nanoscale wire 870 under the address 1100 is driven to a low voltage. The restoration columns for this nanoscale wire 870 are bracketed by Vtop3/Vbot3 and Vtop4/Vbot4, so Vtop3 and Vtop4 are driven to high voltages and the voltage on Vbot3 and Vbot4 are observed. Since the nanoscale wire 870 intersects with two control regions in restoration column 900 and no control regions in restoration column 910, Vbot3 is pulled high while Vbot4 remains low. If restoration column 900 set up as the inverting column, the fact that Vbot3 is pulled high shows that the address 1100 OR term can only be used in its inverting sense.

Figure 27:
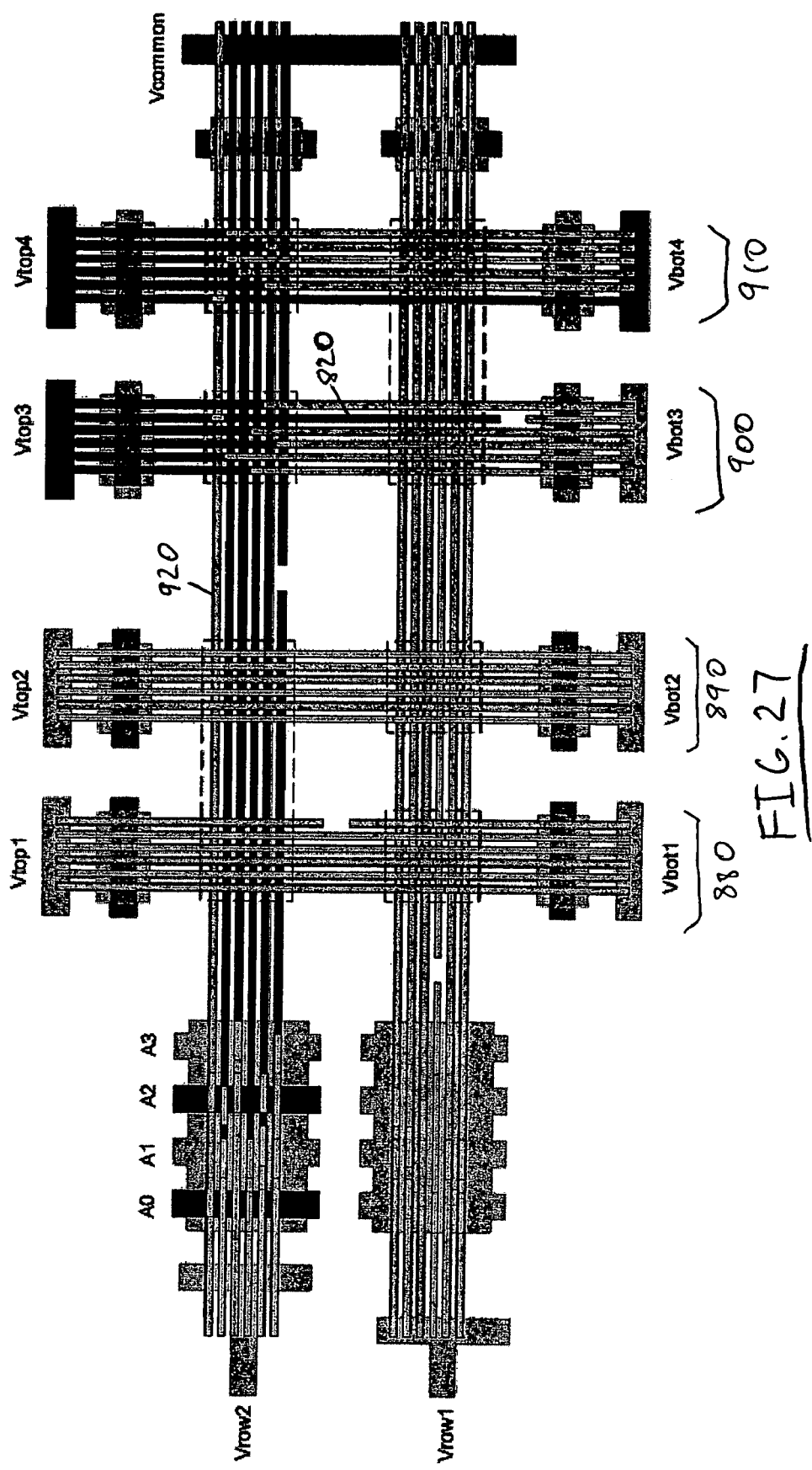
FIG. 27 depicts testing address 1010.

FIG. 27 depicts testing of the nanoscale wire 920 under the address 1010. The nanoscale wire 920 controls restoration wires in both columns 900 and 910. However, the restoration nanoscale wire 820 in column 900 is broken. Consequently only the restoration in column 910 is usable. Vbot4 is pulled high, but Vbot3 remains low because of the broken nanoscale wire 820. This shows that the address 1010 or term can only be used in its non-inverting sense.

Figure 28:
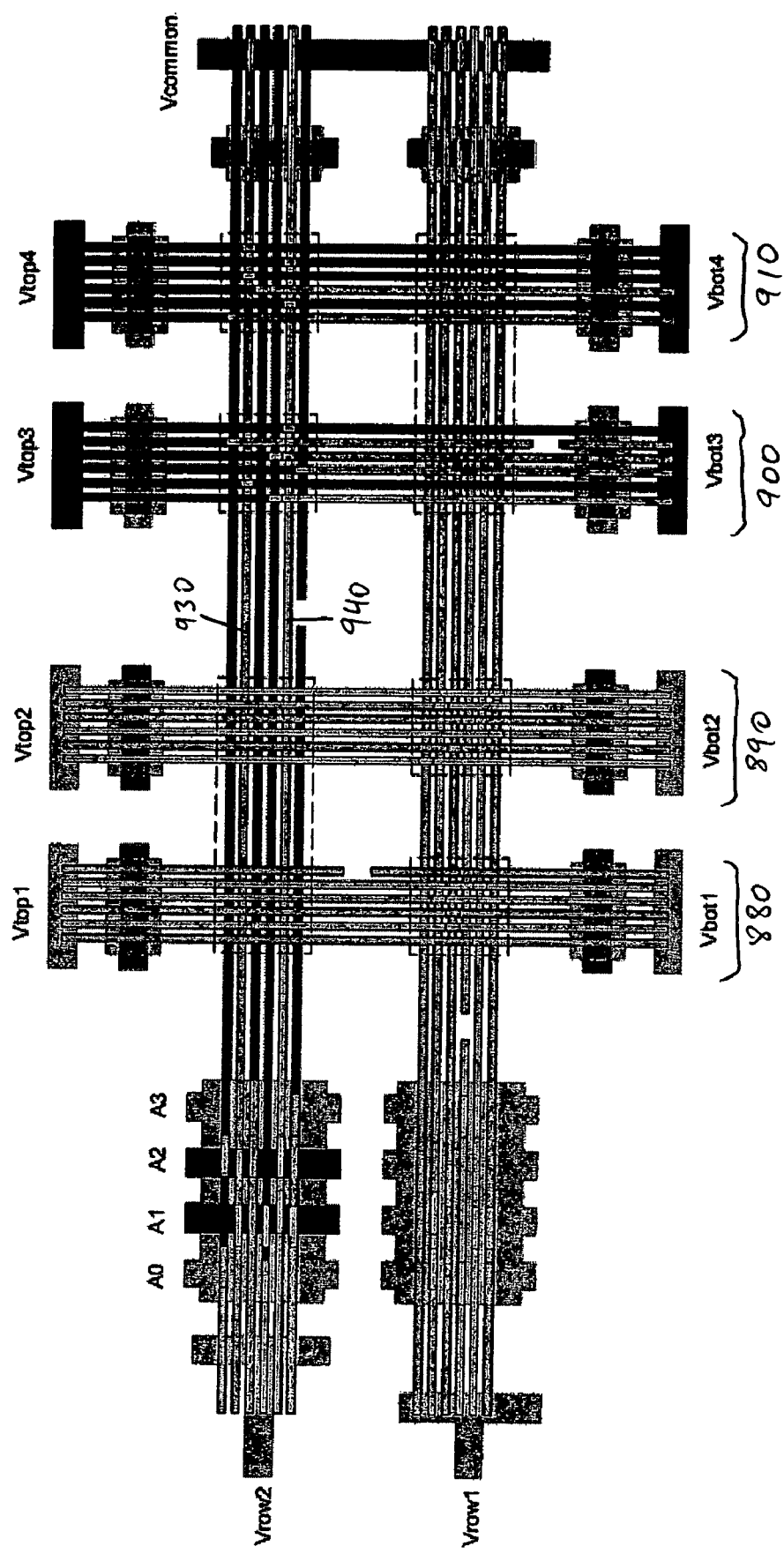
FIG. 28 depicts testing of the address 0110.

FIG. 28 depicts testing of the nanoscale wires under the address 0110. As depicted, there are two nanoscale wires 930 and 940 that are addressed by 0110. So by using address 0110 both nanoscale wires 930 and 940 are affected. By setting nanoscale wires 930 and 940 low, it turns out that there are multiple nanoscale wires in columns 900 and 910 affected by the address 0110 or terms. Both Vbot3 and Vbot4 are driven high showing that both polarities of the 0110 OR-term are available, i.e. the term is binate.

Similar tests can be performed on the plane B. In this case, the outputs of this or plane are restored by columns 880 and 890. High test values are driven into Vbot1 and Vbot2 and the voltages at Vtop1 and Vtop2 are observed; the role of top and bottom supplies are reversed compared to the plane A to match the fact that the position of the restoration array and the succeeding OR array are reversed. After performing the test, it is determined that the addresses 1100 and 1010 are binate, 0110 is non-inverting, and 0101 is inverting.

Figure 29:
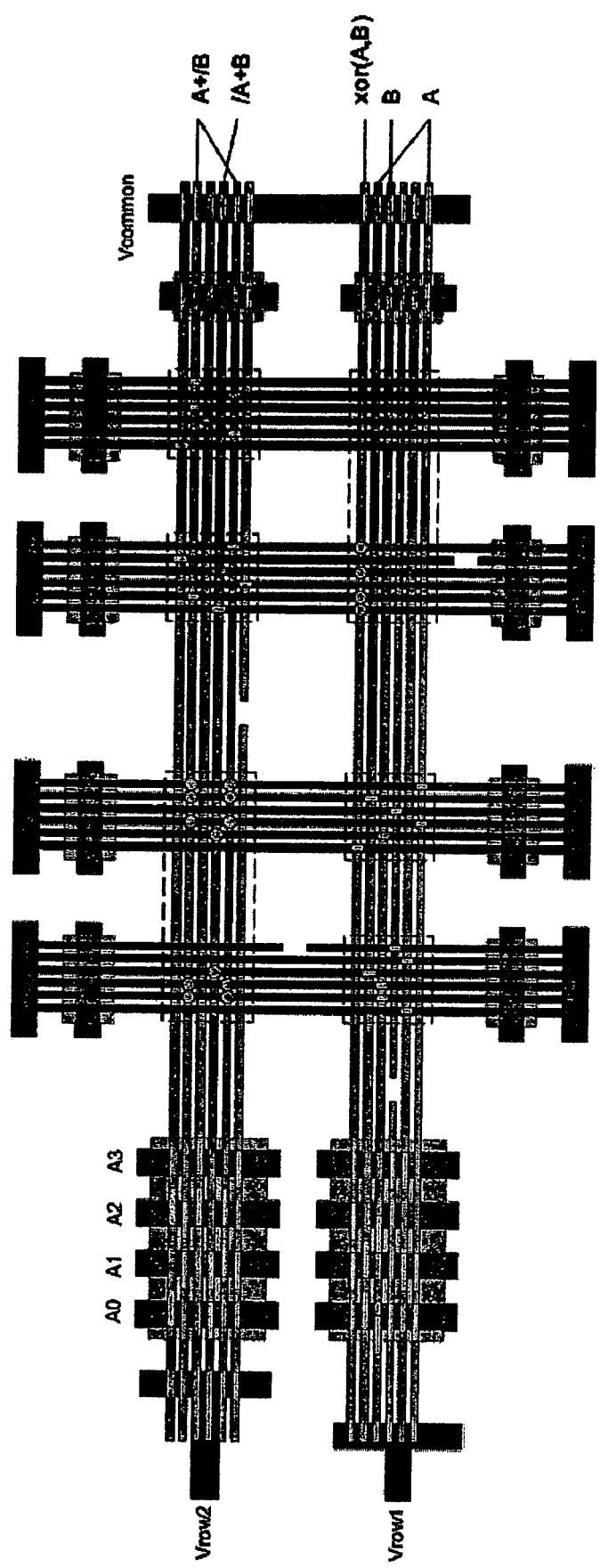
FIG. 29 depicts an assignment of known good OR terms to the XOR calculation.

By knowing which polarities are available from each of the present addresses, it is possible to program the intended function. FIG. 29 depicts an assignment of known, good OR terms to the XOR calculation. The inputs A and B on the bottom or terms 1100 and 1010 are brought in. Both polarities of A and B are needed, and both of the terms 1100 and 1010 are binate. The $\overline{A}$+B is computed on the top or term 1100 since it is inverting, the A+$\overline{B}$ is computed on the top or term 0110 which is binate so it can provide an inverted output. Finally, bottom or term 0110 is used to OR together $\overline{A}$+B and $\overline{A+B}$ to produce the XOR of A and B.

Figure 30:
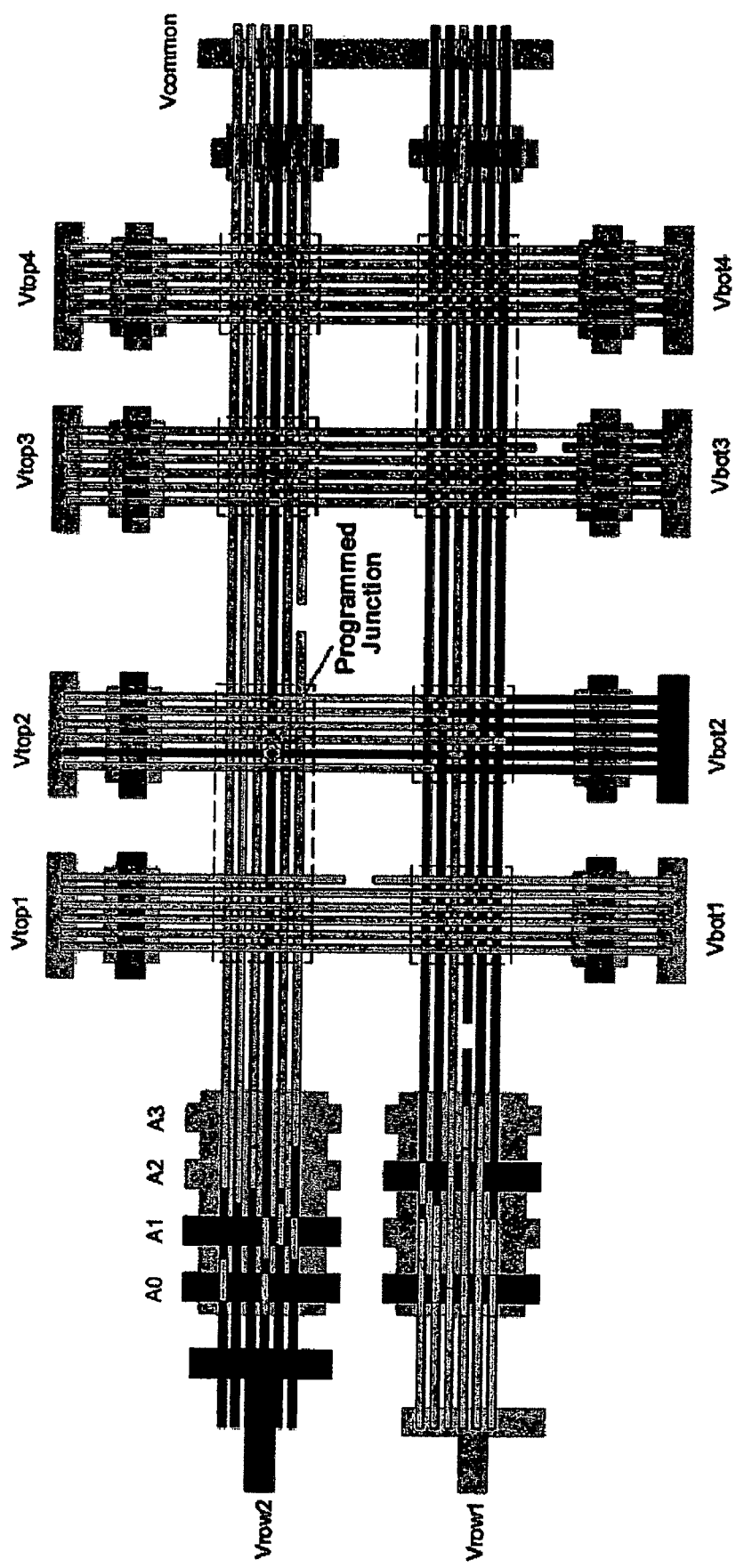
FIG. 30 depicts restoring signal B as an input to the $\overline{A+B}$ in the top plane.

To program up each crosspoint, suitable voltages must be applied to both the nanoscale wires in the junction. For example, to make the restored B an input to the $\overline{A}$+B in the top plane, the low addresses are set to 1010 to select B's OR term and the high address to 1100 to select the $\overline{A}$+B OR nanoscale wire, as depicted in FIG. 30. Similar to polarity testing above, the plane B nanoscale wires are precharged to high and then Vrow1 is driven to low so that only the 1010 address is low and enables conduction to the OR plane. Vrow2 is driven directly to the low voltage needed for junction programming. Vbot2 is driven to the high voltage needed for junction programming, and Vbot1 is left at a nominal voltage so that the non-inverting B input is programmed. The Vtop3, Vtop4, Vbot3, Vbot4 are kept at nominal voltages so that junctions in the bottom-right or plane B are not programmed while the intended junction in the top-left or plane A is being programmed.

Figure 31:
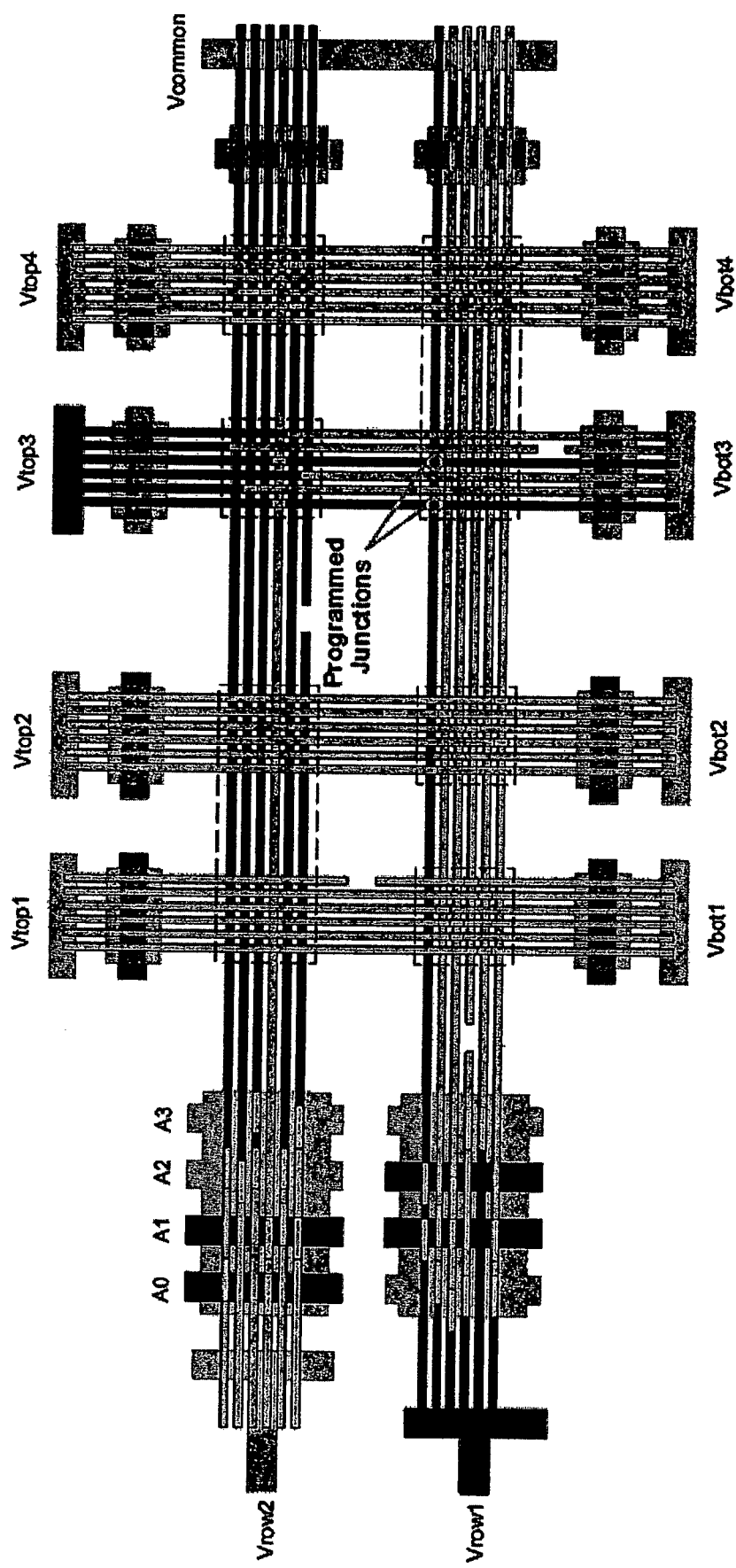
FIG. 31 depicts programming of the $\overline{A+B}$ to XOR junction.

To program a junction in the bottom-right or plane, the programming voltages on Vtop3 or Vtop4 are driven while voltages on Vbot1 and Vbot2 are kept at nominal voltages. For example, in FIG. 31 depicts programing of the $\overline{A+B}$ to XOR junction. Here Vtop3 is placed at the high programming voltage since connection is inverting, and Vtop4 is held at a nominal voltage along with Vbot1 and Vbot2.

While several illustrative embodiments of the invention have been shown and described, numerous variations and, alternative embodiments will occur to those skilled in the art. Such variations and alternative embodiments are contemplated, and can be made without departing from the scope of the invention as defined in the appended claims.

What is claimed is:

1. A programmable logic array (PLA) comprising:
   a first plurality of nanoscale wires forming PLA inputs; and
   a restoring inverting arrangement connected with the PLA inputs, comprising a second plurality of nanoscale wires, the restoring inverting arrangement restoring signals on the PLA inputs and inverting the signals on the PLA inputs.

2. The PLA of claim 1, further comprising:
   a restoring non-inverting arrangement connected with the PLA inputs, comprising a third plurality of nanoscale wires, the restoring non-inverting arrangement restoring the signals on the PLA inputs without inverting the signals on the PLA inputs.

3. The PLA of claim 1, further comprising:
   a fourth plurality of nanoscale wires crossing the second plurality of nanoscale wires.

4. The PLA of claim 2, further comprising:
   a fourth plurality of nanoscale wires crossing the second plurality of nanoscale wires and the third plurality of nanoscale wires.

5. The PLA of claim 3, further comprising:
   programmable ON-OFF devices associated with crossings between the second and fourth plurality of nanoscale wires.

6. The PLA of claim 4, further comprising:
   programmable ON-OFF devices associated with crossings between the second and fourth plurality of nanoscale wires and crossings between the third and fourth plurality of nanoscale wires.

7. The PLA of claim 5, wherein the ON-OFF devices are diodes.

8. The PLA of claim 6, wherein the ON-OFF devices are diodes.

9. The PLA of claim 1, wherein one or more nanoscale wires of the second plurality of nanoscale wires comprise controllable regions.

10. The PLA of claim 1, wherein the nanoscale wires of the second plurality of nanoscale wires are assembled stochastically.

11. The PLA of claim 2 wherein one or more nanoscale wires of the second and third plurality of nanoscale wires comprise controllable regions.

12. The PLA of claim 11, wherein the nanoscale wires of the second and third plurality of nanoscale wires are assembled stochastically.

13. The PLA of claim 9 wherein the controllable regions, in conjunction with a plurality of voltages, invert the signals on the PLA inputs along the nanoscale wires of the second plurality of nano scale wires.

14. The PLA of claim 11 wherein the controllable regions, in conjunction with a plurality of voltages, invert or non-invert the signals on the PLA inputs along the nanoscale wires of the second and third plurality of nanoscale wires, respectively.

15. The PLA of claim 9, wherein the controllable regions are distributed along a portion of the nanoscale wires of the second plurality of nanoscale wires.

16. The PLA of claim 10, wherein the controllable regions are distributed along a portion of the nanoscale wires of the second and third plurality of nanoscale wires.

17. The PLA of claim 1, further comprising:
a plurality of ohmic contacts connected with the PLA inputs, allowing the PLA inputs to be selected.

18. The PLA of claim 17 wherein the ohmic contacts are nanoscale ohmic contacts.

19. The PLA of claim 17 wherein the ohmic contacts are lithographic ohmic contacts.

20. The PLA of claim 17, wherein the PLA inputs are selectable through the ohmic contacts by means of controllable regions located along portions of nanoscale wires of the first plurality of nanoscale wires.

21. The PLA of claim 17, wherein the PLA inputs are independently selectable through the ohmic contacts by means of controllable regions located along portions of nanoscale wires of the first plurality of nanoscale wires.

22. The PLA of claim 1, further comprising:
one or more field-effect junctions connected with the first plurality of nanoscale wires, allowing the first plurality of nano scale wires to be controlled.

23. The PLA of claim 3, further comprising:
one or more field-effect junctions connected with the first plurality of nanoscale wires, allowing the first plurality of nanoscale wires to be controlled; and
one or more field-effect junctions connected with the fourth plurality of nanoscale wires, allowing the fourth plurality of nanoscale wires to be controlled.

24. The PLA of claim 23, further comprising:
one or more field-effect junctions connected with the second plurality of nanoscale wires, allowing the second plurality of nanoscale wires to be controlled.

25. The PLA of claim 4, further comprising:
a first plurality of programmable ON-OFF devices associated with crossings between the second and fourth plurality of nanoscale wires;
a second plurality of programmable ON-OFF devices associated with crossings between the third and fourth plurality of nanoscale wires;
one or more field-effect junctions connected with the first plurality of nanoscale wires, allowing the first plurality of nanoscale wires to be controlled;
one or more field-effect junctions connected with the second plurality of nanoscale wires, allowing the second plurality of nanoscale wires to be controlled;
one or more field-effect junctions connected with the third plurality of nanoscale wires, allowing the third plurality of nanoscale wires to be controlled; and
one or more of field-effect junctions connected with the fourth plurality of nanoscale wires, allowing the fourth plurality of nanoscale wires to be controlled.

26. The PLA of claim 25, wherein:
one or more nanoscale wires of the second plurality of nanoscale wires comprise first controllable regions, wherein the first controllable regions, in conjunction with a plurality of voltages, invert the signals on the PLA inputs along the nanoscale wires of the second plurality of nanoscale wires; and
one or more nanoscale wires of the third plurality of nanoscale wires comprise second controllable regions, wherein the second controllable regions, in conjunction with a plurality of voltages, non-invert the signals on the PLA inputs along the nanoscale wires of the third plurality of nanoscale wires.

27. The PLA of claim 26, further comprising:
a restoring inverting arrangement connected with the PLA inputs, comprising a fifth plurality of nanoscale wires, the restoring inverting arrangement restoring the signals on the PLA inputs and inverting the signals on the PLA inputs; and
a restoring non-inverting arrangement connected with the PLA inputs, comprising a sixth plurality of nanoscale wires, the restoring non-inverting arrangement restoring signals on the PLA inputs without inverting the signals on the PLA inputs.

28. The PLA of claim 27, further comprising:
a third plurality of programmable ON-OFF devices associated with crossings between the first and fifth plurality of nanoscale wires;
a fourth plurality of programmable ON-OFF devices associated with crossings between the first and sixth plurality of nanoscale wires;
one or more field-effect junctions connected with the fifth plurality of nanoscale wires, allowing the fifth plurality of nanoscale wires to be controlled; and
one or more field-effect junctions connected with the sixth plurality of nano scale wires, allowing the sixth plurality of nano scale wires to be controlled.

29. The PLA of claim 28, wherein
one or more nanoscale wires of the fifth plurality of nanoscale wires comprise controllable regions, wherein the controllable regions, in conjunction with a plurality of voltages, invert the signals along the nanoscale wires of the fifth plurality of nanoscale wires; and
one or more nanoscale wires of the sixth plurality of nanoscale wires comprise controllable regions, wherein the controllable regions, in conjunction with a plurality of voltages, non-invert the signals along the nanoscale wires of the sixth plurality of nanoscale wires.

30. An electric circuit comprising programmable logic arrays (PLAs) wherein:
each PLA comprises nanoscale wires forming PLA inputs and at least one between a restoring inverting stage and a restoring non-inverting stage, the restoring inverting stage and the restoring non-inverting stage comprising nanoscale wires and restoring or inverting signals, respectively, of the PLA inputs;
each PLA comprises programmable ON-OFF devices associated with crosspoints between the nanoscale wires, forming ON-OFF stages; and
an output of at least one PLA is an input to at least one other PLA.

31. The electric circuit of claim 30, further comprising one or more isolation transistors associated with the PLA inputs and PLA outputs.

32. The electric circuit of claim 31, wherein the isolation transistors route connections between the PLA inputs, the PLA outputs, and the PLAs.

33. The electric circuit of claim 30, further comprising microscale wires controlling the ON-OFF stages.

34. The electric circuit of claim 30, wherein the nanoscale wires are stochastically assembled to provide nanoscale wire addressability.

35. The electronic circuit of claim 30, wherein nanoscale wires of two different PLAs are shared between the two different PLAs.

36. The electronic circuit of claim 35, wherein sharing of nanoscale wires between the two different PLAs is obtained through isolation transistors.

37. The electronic circuit of claim 36, wherein the sharing of nanoscale wires allows two or more PLAs to be programmed from a same set of micro scale wires.

38. A method of building a programmable logic array (PLA), the method comprising:
providing a first plurality of nanoscale wires forming PLA inputs;
providing a restoring inverting arrangement connected with the PLA inputs, the restoring inverting arrangement comprising a second plurality of nanoscale wires and restoring signals on the PLA inputs and inverting the signals on the PLA inputs.

39. The method of claim 38, further comprising:
providing a restoring non-inverting arrangement connected with the PLA inputs, the restoring non-inverting arrangement comprising a third plurality of nanoscale wires and restoring the signals on the PLA inputs without inverting the signals on the PLA inputs.

40. The method of claim 38, further comprising:
providing a fourth plurality of nanoscale wires crossing the second plurality of nanoscale wires.

41. The method of claim 39, further comprising:
providing a fourth plurality of nanoscale wires crossing the second plurality of nanoscale wires and the third plurality of nanoscale wires.

42. The method of claim 40 further comprising:
providing programmable ON-OFF devices associated with crossings between the second and fourth plurality of nanoscale wires.

43. The method of claim 42, further comprising:
providing microscale addressing of the first and fourth plurality of nanoscale wires allowing the programmable ON-OFF devices to be set to their ON or OFF state.

44. The method of claim 43, further comprising:
providing the nanoscale wires with axially doped regions; and
stochastically assembling the nanoscale wires.

45. The method of claim 44 where the stochastically assembled, axially doped nanoscale wires provide microscale addressing.

46. The method of claim 41 further comprising:
providing programmable ON-OFF devices associated with crossings between the second and fourth plurality of nano scale wires and crossings between the third and fourth plurality of nano scale wires.

47. The method of claim 42, wherein the ON-OFF devices are diodes.

48. The method of claim 46, wherein the ON-OFF devices are diodes.

49. The method of claim 38, further comprising:
providing controllable regions on one or more nanoscale wires of the second plurality of nanoscale wires.

50. The method of claim 49, further comprising:
stochastically assembling the nanoscale wires of the second plurality of nanoscale wires, wherein stochastic selection of nanoscale wires of the second plurality of nanoscale wires by means of the controllable regions is used to build the restoring arrangement.

51. The method of claim 39 further comprising:
providing controllable regions on one or more nano scale wires of the second and third plurality of nanoscale wires.

52. The method of claim 51, further comprising:
stochastically assembling the nanoscale wires of the second and third plurality of nanoscale wires, wherein stochastic selection of nanoscale wires of the second plurality of nanoscale wires by means of the controllable regions is used to build the restoring arrangement.

53. The method of claim 49 further comprising:
applying voltages for the controllable regions so that the controllable regions invert the signals on the PLA inputs along the nano scale wires of the second plurality of nanoscale wires.

54. The method of claim 51 further comprising:
applying voltages for the controllable regions so that the controllable regions invert or non-invert the signals on the PLA inputs along the nanoscale wires of the second and third plurality of nanoscale wires, respectively.

55. The method of claim 49, wherein the controllable regions are distributed along a portion of the nanoscale wires of the second plurality of nanoscale wires.

56. The method of claim 55, wherein the nanoscale wires of the second plurality of nano scale wires are stochastically assembled.

57. The method of claim 51, wherein the controllable regions are distributed along a portion of the nanoscale wires of the second and third plurality of nanoscale wires.

58. The method of claim 57, wherein the nanoscale wires of the second and third plurality of nanoscale wires are stochastically assembled.

59. The method of claim 38, further comprising:
connecting a plurality of ohmic contacts with the PLA inputs, allowing the PLA inputs to be selected.

60. The method of claim 39, further comprising:
connecting a plurality of ohmic contacts with the PLA inputs, allowing the PLA inputs to be selected.

61. The method of claim 59 wherein the ohmic contacts are nanoscale ohmic contacts.

62. The method of claim 59 wherein the ohmic contacts are lithographic ohmic contacts.

63. The method of claim 59, further comprising:
selecting the PLA inputs through the ohmic contacts by the means of controllable regions located along portions of nanoscale wires of the first plurality of nanoscale wires.

64. A method of placing a signal on a nanoscale wire forming an input of a programmable logic array (PLA), the method comprising:
providing a plurality of nanoscale wires forming PLA inputs, wherein each of the nanoscale wires forming PLA inputs comprises one or more controllable regions;
crossing a plurality of ohmic contacts with the controllable regions of the nanoscale wires forming PLA inputs;
applying a first voltage to the nanoscale wires forming PLA inputs;
providing ohmic contacts to correspond with the controllable regions of at least one nanoscale wire forming a PLA input;
applying a second voltage to some of the ohmic contacts; and
applying a third voltage to the remaining ohmic contacts.

65. A method of inverting and restoring an input signal, the method comprising:
providing a first plurality of nanoscale wires forming PLA inputs;
providing a second plurality of nanoscale wires, wherein each nanoscale wire of the second plurality of nano scale wires comprises a first end point, a second end point, at least two field effect junctions between the first end point and the second end point, and one or more controllable regions between the at least two field effect junctions;

providing ohmic contacts at the first and second endpoints;

crossing the controllable regions of the second plurality of nanoscale wires with the first plurality of nanoscale wires;

applying a first and second voltages to the at least two field effect junctions so as to discharge any residual voltage on the second plurality of nanoscale wires;

applying a signal to the first plurality of nanoscale wires forming PLA inputs; and applying a third voltage and a fourth voltage to the first end point and the second end point, respectively, so as to cause the signal to be inverted on one of the nanoscale wires in the second plurality of nanoscale wires.

66. The method of claim 65, wherein a voltage range to gate conduction is different from a voltage range used by the nanoscale wires, to allow the at least two field effect junctions to be self aligned.

67. A method of non-inverting and restoring an input signal, the method comprising:

providing a first plurality of nanoscale wires forming inputs of a programmable logic array (PLA);

providing a second plurality of nanoscale wires, wherein each nanoscale wire of the second plurality of nanoscale wires comprises a first end point, a second end point, at least two field effect junctions between the first end point and the second end point, and one or more controllable regions between the at least two field effect junctions;

crossing the controllable regions of the second plurality of nanoscale wires with the first plurality of nanoscale wires;

applying a first and second voltages to the at least two field effect junctions so as to discharge any residual voltage on the second plurality of nanoscale wires;

applying a signal to the first plurality of nanoscale wires forming PLA inputs; and applying a third voltage and a forth voltage to the first end point and the second end point, respectively, so as to cause the signal to be non-inverted on one of the nanoscale wires in the second plurality of nanoscale wires.

68. The method of claim 67, wherein a voltage range to gate conduction is different from a voltage range used by the nanoscale wires, to allow the at least two field effect junctions to be self aligned.

69. A method of OR-ing input signals, the method comprising:

providing a first plurality of nanoscale wires forming inputs of an OR function;

providing a second plurality of nanoscale wires forming outputs of the OR function, wherein each nanoscale wire of the second plurality of nanoscale wires comprises a first end point, a second end point, and at least one field effect junction between the first end point and the second end point;

crossing the first plurality of nanoscale wires with the second plurality of nanoscale wires so that a plurality of crossing points are disposed between the at least one field effect junction and the first end point;

providing ON-OFF devices;

electrically connecting the first plurality of nanoscale wires with the second plurality of nanoscale wires at the plurality of crossing points through the ON-OFF devices;

applying a first voltage to the at least one field effect junction, so as to discharge any residual voltage on the second plurality of nanoscale wires;

applying a second voltage to the second end; and applying one or more signals to the first plurality of nanoscale wires forming inputs of the OR function so as to cause the one or more signals to be OR-ed on one of the nanoscale wires in the second plurality of nanoscale wires.

70. The method of claim 69, wherein a voltage range to gate conduction is different from a voltage range used by the nanoscale wires, to allow the at least two field effect junctions to be self aligned.

71. A method of AND-ing input signals, the method comprising:

providing a first plurality of nano scale wires forming inputs of an AND function;

providing a second plurality of nanoscale wires forming outputs of the AND function, wherein each nanoscale wire of the second plurality of nanoscale wires comprises a first end point, a second end point, and at least one field effect junction between the first end point and the second end point;

crossing the first plurality of nanoscale wires with the second plurality of nanoscale wires so that a plurality of crossing points are disposed between the at least one field effect junction and the first end point;

providing ON-OFF devices;

electrically connecting the first plurality of nanoscale wires with the second plurality of nanoscale wires at the plurality of crossing points through the ON-OFF devices;

applying a first voltage to the at least one field effect junction, so as to charge the second plurality of nanoscale wires;

applying a second voltage to the second end; and applying one or more signals to the first plurality of nanoscale wires forming inputs of the AND function so as to cause the one or more signals to be AND-ed on one of the nanoscale wires in the second plurality of nanoscale wires.

72. A method for implementing a circuital logic at nanoscale level, comprising:

providing microscale wires;

providing nanoscale wires associated with the microscale wires;

forming nano-nanoscale crosspoints between nanoscale wires and nanoscale wires; and programming the nano-nanoscale crosspoints.

73. The method of claim 72, wherein the nano-nanoscale crosspoints are formed by means of controllable regions axially distributed on the nanoscale wires.

74. The method of claim 72, further comprising:

identifying functioning nanoscale wires among the nanoscale wires.

75. A method for restoring nanoscale signals, comprising:

providing nanoscale input wires adapted to carry input signals to be restored;

providing nanoscale output wires to provide restored outputs;

crossing the nanoscale input wires with the nanoscale output wires, thus forming crossing regions;

providing ohmic contacts to power supplies, associated with the nanoscale output wires; and providing field-effect control lines, associated with the nanoscale output wires.

76. The method of claim 75, wherein the nanoscale input wires are orthogonally crossed with the nanoscale output wires.

77. The method of claim 75, wherein the nanoscale output wires comprise controllable regions.

78. The method of claim 77, wherein the controllable regions are manufactured into the nanoscale wires during construction.

79. The method of claim 78, wherein the nanoscale output wires are assembled by random selection from a collection of nanoscale wires with controllable regions.

80. The method of claim 77, wherein the controllable regions are in proximity of the crossing regions.

81. The method of claim 77, wherein placement of the controllable regions is varied by random alignment of the nanoscale output wires.

82. A programming region for a sublithographic programmable logic array (PLA), wherein the PLA comprises a first set of nanoscale wires and a second set of nanoscale wires intersecting the first set of nanoscale wires, the programming region comprising:
   a set of microscale wires crossing the first set of nanoscale wires; and
   controllable regions distributed along the nanoscale wires of the first set of nanoscale wires, allowing the nanoscale wires to be controlled by means of signals input to the set of micro scale wires,
   wherein the signals input to the set of microscale wires allow at least one of the nanoscale wires of the first set of nano scale wires to be programmed with a signal used as an input for the PLA.

83. A plurality of programmable logic arrays (PLAs), each PLA comprising a first set of nanoscale wires, a second set of nanoscale wires intersecting the first set of nanoscale wires, and a programming region, wherein:
   first sets of nanoscale wires for different PLAs being shared among the different PLAs, thus forming a common set of nanoscale wires; and
   the programming region is shared among the PLAs.

84. The plurality of PLAs of claim 83, wherein the programming region is shared among the PLAs through the common set of nano scale wires.

85. The plurality of PLAs of claim 84, wherein the programming region comprises:
   a set of microscale wires crossing the common set of nanoscale wires; and
   controllable regions distributed along the nanoscale wires of the common set of nanoscale wires, allowing the nanoscale wires to be controlled by means of signals input to the set of micro scale wires,
   wherein the signals input to the common set of microscale wires allow at least one of the nanoscale wires of the common set of nanoscale wires to be programmed with a signal used as an input for the PLA.

86. The plurality of PLAs of claim 85, further comprising isolation transistors to allow independent functioning of individual PLAs of the plurality of PLAs.

87. The plurality of PLAs of claim 86, wherein the isolation transistors are disposed along the common set of nanoscale wires between the individual PLAs.

* * * * *